United States Patent [19]
Turner et al.

[11] Patent Number: 5,576,629
[45] Date of Patent: Nov. 19, 1996

[54] PLASMA MONITORING AND CONTROL METHOD AND SYSTEM

[75] Inventors: Terry R. Turner, Austin; James D. Spain, Georgetown; John R. Swyers, Austin, all of Tex.

[73] Assignee: Fourth State Technology, Inc., Austin, Tex.

[21] Appl. No.: 328,069

[22] Filed: Oct. 24, 1994

[51] Int. Cl.⁶ .......................... C23C 14/00; C23C 14/34; H01L 21/306
[52] U.S. Cl. .................. 324/709; 336/155; 204/298.32; 204/298.08; 204/192.33; 315/111.21; 156/345; 156/643.1
[58] Field of Search .................. 324/709; 156/643.1, 156/345, 626; 336/155; 216/59; 204/298.32, 298.08, 192.33; 315/111.21

[56] References Cited

U.S. PATENT DOCUMENTS

| | | |
|---|---|---|
| 4,846,920 | 7/1989 | Keller et al. ............... 156/345 |
| 4,954,212 | 9/1990 | Gabriel et al. ............. 156/627 |
| 5,116,482 | 5/1992 | Setoyama et al. .......... 204/298 |
| 5,135,604 | 8/1992 | Kumar et al. ............. 156/626 |
| 5,175,472 | 12/1992 | Johnsonm, Jr. et al. ...... 315/111 |
| 5,314,603 | 5/1994 | Sugiyama et al. ......... 204/298 |
| 5,325,019 | 6/1994 | Miller et al. ............. 315/111 |

*Primary Examiner*—Kenneth A. Wieder
*Assistant Examiner*—Barry C. Bowser
*Attorney, Agent, or Firm*—Baker & Botts L.L.P.

[57] ABSTRACT

A plasma monitoring and control method and system monitor and control plasma in an electronic device fabrication reactor by sensing the voltage of the radio frequency power that is directed into the plasma producing gas at the input to the plasma producing environment of the electronic device fabrication reactor. The method and system further senses the current and phase angle of the radio frequency power directed to the plasma producing gas at the input to the plasma producing environment. Full load impedance is measured and used in determining characteristics of the plasma environment, including not only discharge and sheath impedances, but also chuck and wafer impedances, primary ground path impedance, and a secondary ground path impedance associated with the plasma environment. This permits end point detection of both deposition and etch processes, as well as advanced process control for electronic device fabrication. The invention also provides automatic gain control features for applying necessary signal gain control functions during the end point and advanced process control operations.

43 Claims, 19 Drawing Sheets

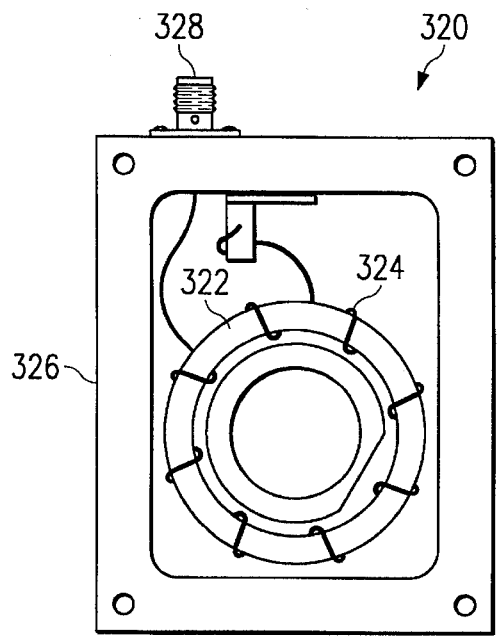 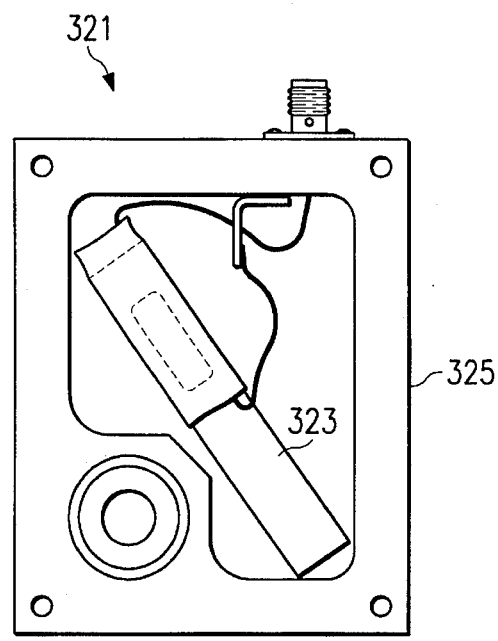
FIG. 18A    FIG. 18B
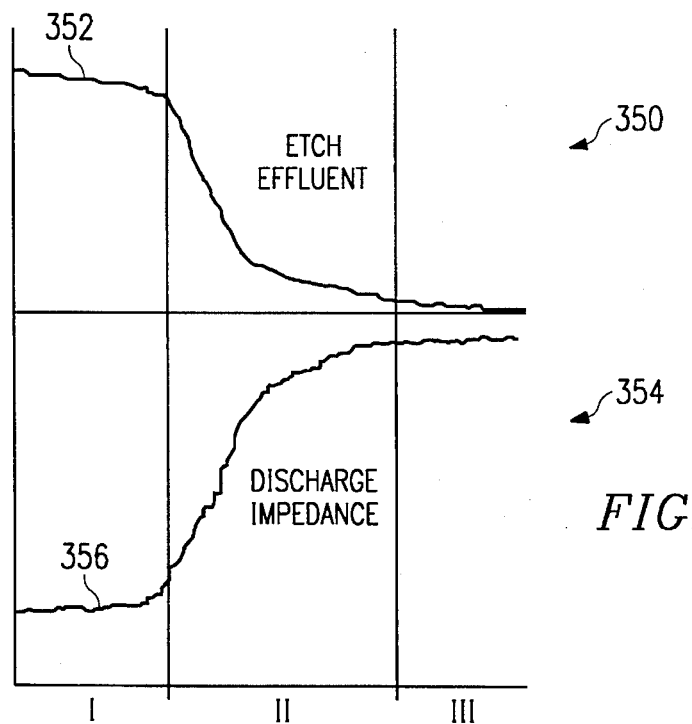
FIG. 20

FILM STRESS DESIGNED EXPERIMENT RESULTS

| TRIAL | TEOS | GAP | RF | STRESS | v0 | v1 | v2 | v3 | v4 | i0 | i1 | i2 | i3 | i4 | ph |
|---|---|---|---|---|---|---|---|---|---|---|---|---|---|---|---|
| | | | | | | | | | RFMS PARAMETERS | | | | | | |
| 1 | 1 | -1 | -1 | 0.6817 | 2075 | 4215 | 4757 | 1845 | 1073 | 23.3 | 64.6 | 47.3 | 16.0 | 10.0 | 10.7 |
| 2 | 1 | 1 | -1 | 0.9132 | 1387 | 584 | 40.5 | 29.2 | 38.4 | 6.11 | 0.490 | 0.176 | 0.232 | 0.364 | -19.9 |
| 3 | -1 | -1 | 1 | -2.47 | 1527 | 1172 | 27.5 | 15.5 | 28.3 | 7.91 | 1.056 | 0.433 | 0.086 | 0.212 | -19.6 |
| 4 | -1 | -1 | -1 | -0.483 | 1466 | 894 | 19.2 | 14.9 | 31.3 | 7.32 | 0.799 | 0.408 | 0.074 | 0.254 | -20.5 |
| 5 | 1 | -1 | 1 | -1.066 | 1486 | 998 | 38.1 | 15.9 | 23.6 | 6.82 | 0.898 | 0.516 | 0.136 | 0.172 | -20.8 |
| 6 | -1 | 1 | -1 | -0.1865 | 1441 | 804 | 58.4 | 25.3 | 30.0 | 5.14 | 0.588 | 0.521 | 0.232 | 0.284 | -28.4 |
| 7 | 0 | 0 | 0 | -0.5755 | 1470 | 926 | 82.0 | 34.0 | 27.4 | 6.40 | 0.751 | 0.689 | 0.337 | 0.340 | -23.1 |
| 8 | 1 | 1 | 1 | -0.5029 | 1487 | 982 | 40.8 | 24.4 | 35.0 | 9.75 | 1.176 | 0.304 | 0.192 | 0.321 | -12.7 |
| 9 | -1 | 1 | 1 | -1.098 | 1522 | 1152 | 56.3 | 21.1 | 22.3 | 8.86 | 1.173 | 0.597 | 0.209 | 0.212 | -17.1 |
| 10 | 0 | 0 | 0 | -0.5996 | 1469 | 927 | 81.2 | 25.9 | 15.4 | 5.66 | 0.726 | 0.799 | 0.288 | 0.222 | -26.0 |
| 11 | 0 | 0 | 0 | -0.5725 | 1471 | 937 | 55.4 | 11.5 | 15.4 | 5.70 | 0.829 | 0.773 | 0.141 | 0.083 | -25.6 |

*FIG. 29*

COEFFICIENT TABLE AND ANOVA FOR STRESS MODEL

| DEP VAR: STRESS | N: 10 | MULTIPLE R: 0.978 | | SQUARED MULTIPLE R: 0.956 | |
|---|---|---|---|---|---|
| ADJUSTED SQUARED MULTIPLE R: .934 | | | | STANDARD ERROR OF ESTIMATE: 0.216 | |

| VARIABLE | COEFFICIENT | STD ERROR | STD COEF | TOLERANCE | T | P(2 TAIL) |
|---|---|---|---|---|---|---|
| CONSTANT | 4.366 | .452 | 0.000 | . | 9.668 | 0.000 |
| V1 | −0.009 | .001 | −1.784 | 0.133 | −7.621 | 0.000 |
| I1 | 3.128 | .798 | 0.858 | 0.152 | 3.920 | 0.008 |
| I2 | 1.450 | .490 | 0.344 | 0.538 | 2.958 | 0.025 |

ANALYSIS OF VARIANCE

| SOURCE | SUM-OF-SQUARES | DF | MEAN-SQUARE | F-RATIO | P |
|---|---|---|---|---|---|
| REGRESSION | 6.126 | 3 | 2.042 | 43.758 | 0.000 |
| RESIDUAL | 0.280 | 6 | 0.047 | | |

PLASMA MONITORING AND CONTROL METHOD AND SYSTEM

TECHNICAL FIELD OF THE INVENTION

The present invention relates to methods of monitoring and controlling the fabrication of an electronic device and, particularly, to a method and system for plasma monitoring and control that provides monitoring and control of radio frequency power including monitoring and control of radio frequency voltage, current, and phase angle, as well as harmonics of theses parameters as they affect the production of radio frequency plasma.

BACKGROUND OF THE INVENTION

The popularity of plasma processing continues to grow throughout the semiconductor industry. Although some new equipment is being designed to operate in microwave frequencies, the vast majority of both new and installed tools operate in the radio frequency or RF band of between 0.1 to 13.56 MHz. Although various process tools explore the use of frequency attributes, for the most part RF power is only important to plasma generation. This fact is important, because the repeatability of the plasma process almost entirely depends on the repeatability of the plasma.

As the principal driving force in plasma formation, the RF frequency and power should be the most carefully controlled and best understood machine parameter. Unfortunately, this is most typically not the case. FIG. 1, for example, shows RF network 10 that produces RF power for an electronic device and fabrication reactor. In particular, for producing RF plasma generation, RF power generator 12 connects to local automated matching network 14 via cable 16. From local automated matching network 14, mechanical RF connection 18 goes to process chamber 20. Process chamber 20 includes cathode 22 that affects process gas 24 within plasma sheath 26 to produce an RF plasma.

In RF network 10, certain limitations exist. For example, RF power generator 12, while including solid state technology, still is a bulky system that consumes an undesirable about of clean room floor space. As a result, performance of RF network 10 is often adversely affected by installation dependencies due to generator placement. The objective of local automated matching network 14 is to provide an efficient transfer of RF power from the RF power generator 12 to the RF load of plasma process gas 24 by matching the widely different impedances between RF power generator 12 and process chamber 20 (the RF load). Unfortunately, this match is accomplished by non-ideal impedance elements. This is particularly unfortunate considering the fact that impedance monitoring is a fundamental criterion in a frequency bands of interest to semiconductor plasma processing.

A further limitation of RF network 10 relates to process chamber 20 itself. Within process chamber 20, the electronic device, such as a semiconductor wafer, is positioned and processed to achieve some desired result such as etch or deposition. With regard to process chamber 20, two significant limitations exist. First of all, even with known installation dependencies and variability due to the local automated matching network 14, the RF power is primarily controlled based on a measurement made at RF power generator 12. Furthermore, even though RF power generator 12 for a given power level consists of three variables of voltage, current and phase angle, known systems generally measure and control RF power with the unit of watts only.

FIGS. 2 and 3 illustrate the limitations that exist when RF load power is measured only in terms of watts. In FIG. 2 appears diagram 30 that includes origin 32 having axes 34, 36 and 38. Axis 38 denotes the power level for RF power from RF power generator 12. In particular, three-dimensional object 40 depicts the variability that exists with a one-dimensional measure of power. Consider, for example, that for a given power level, the intersection of plane 42 within surface 40 depicts a minimum reflected power. Suppose further that axis 34, for example, represents changes in voltage for a given power level, while axis 36 represents variation in current at the same power level. As FIG. 2 illustrates, for a given power level and minimum reflected load power considerable variability in current and voltage is possible. FIG. 2, however, does not even consider phase angle differences.

FIG. 3 shows an actual measurement example of changes that can occur with a given power level in the three variables of voltage, current and phase angle. In particular, three-dimensional plot 50 shows on axis 52 changes in phase angle between −81 and −87 degrees. On axis 54 appears a scale of RMS current, $A_{RMS}$ ranging from 1.40 to 1.56 $A_{RMS}$. Along axis 56 are voltage measurements between 522 and 528 $V_{RMS}$. As measurement point 58 indicates, for a given minimum RF power to process chamber 20, measurement points 58 exhibit a significant amount of variability. This obviously can significantly affect RF plasma measurement within process chamber 20.

Local automated matching network 14 of RF network 10 may be one of a wide variety of designs, all of which operate by tuning to a minimum reflected power. The dead band concept of matching circuit tuning, where inductive and/or capacitive elements are varied which drive the circuit to an acceptable reflected power level is essentially the concept that FIG. 2 depicts. As FIGS. 2 and 3 illustrate, this concept of only monitoring reflected power could produce an infinite number of voltage, current, and phase angle combinations. For these infinite combinations associated differences in plasma and process parameters relate. The real world example that FIG. 3 illustrates is for a single requested forward/reflected power combination. Thus, data points 58 show the potentially infinite combinations that a widely accepted plasma tool generates operating under nominal conditions.

An additional problem with known RF power networks for producing plasma environments in process chambers, such as process chamber 20, is how known systems treat the RF load from RF generator 14. Known systems treat the RF load as the discharge between two electrodes in process chamber 20. Electronic device fabrication process techniques, however, also treat as important the wall chemistry within process chamber 20. This produces at least one more RF load for RF power from RF generator 12 that the known RF networks ignore. As a result, RF power measurements of the radio frequency power that goes to process chamber 20 to produce process plasma 24 generally do not precisely measure the RF power that the electronic device receives.

SUMMARY OF THE INVENTION

Therefore, a need has arisen for an improved method and system for monitoring and controlling the generation of plasma in electronic device plasma processing.

A need exists for a method and system for producing radio frequency plasma for electronic device processing that addresses the space limitations that existing radio frequency power generators pose for electronic device fabrication clean rooms.

There is a need for an improvement in radio frequency power measurement for radio frequency plasma generation that overcomes problems associated with measuring the power at the radio frequency generator output.

There is still another need for an improved method and system for measuring and controlling the radio frequency power into the plasma process chamber that considers power as more than simply a one-dimensional parameter.

Even still there is a need for an improved method and system for monitoring and controlling the generation of plasma in an electronic device fabrication reactor that fully considers the radio frequency load of an radio frequency power generator by considering the radio frequency load as more than simply the discharge between two electrodes in the process chamber.

In accordance with the present invention, a method and system for plasma monitoring and control is provided that substantially eliminates or reduces disadvantages and problems associated with previously developed and employed methods of monitoring and controlling plasma production and plasma processes for electronic devices. More specifically, one aspect of the invention is a method for monitoring the radio frequency power of the plasma in an electronic device fabrication reactor that includes the necessary components for and steps of first sensing the voltage of the radio frequency power that is directed into a plasma producing gas at the input to the plasma producing environment of the electronic device fabrication reactor. The method, in addition, senses the current and the phase angle of the radio frequency power directed to the plasma producing gas at the input to the plasma producing environment. The method measures the full load that the radio frequency power sees by measuring the full load impedance of the plasma producing environment. The full load, in one embodiment represents not only the discharge and sheath impedances, but also the chuck and wafer impedance, a primary ground path impedance, and a secondary ground path impedance associated with the fabrication reactor plasma environment.

Another aspect of the present invention is a method and system for controlling the fabrication of an electronic device by generating a process halt or go-no-go signal according to predetermined parameters of the plasma process environment in the fabrication reactor. The system includes the necessary components for inputting a plurality of process parameters regarding the electronic device process into a process control computer that has a plurality of process control instructions for controlling the processing of the electronic device. The system implements a process recipe step counter that associates with the plurality of process control instructions for the electronic device fabrication process. By acquiring and storing data, the process control computer receives information regarding the electronic device fabrication environment. The method and system further determine the completion of a predetermined monitor time for monitoring the processing of the electronic device. Then, a predetermined set of process parameters relating to the electronic device are averaged upon the determination of the completion of the predetermined monitor time.

After averaging the process parameters, the method and system determine the presence of a reference subtraction signal to indicate the presence of a reference subtraction instruction in the process control instructions. The reference information is then subtracted from the average process parameters upon the determination of the presence of the reference subtraction signal according to the reference subtraction instruction. The system then checks a plurality of control limits. The control limits form a part of the plurality of process parameters for limiting the control of the electronic device fabrication process according to the subtracted reference information. The method and system then generate an out of control signal upon determining that one or more of the values of the subtracted reference information are beyond an associated one of a plurality of control limits. The method and system then generate a process halt, or go-no-go signal for the electronic device fabrication process control computer in response to the out of control signal.

Still another aspect of the present invention is a method and system for controlling the fabrication of an electronic device by generating an endpoint detection signal according to predetermined parameters of an electronic device fabrication reactor. The method and system include the necessary steps and components for inputting a plurality of process parameters regarding the electronic device fabrication process into a process control computer. The process control computer includes a plurality of process control instructions for controlling the processing of the electronic device fabrication. The method and system then implement a process recipe step counter associated with the plurality of process control instructions. By acquiring and storing within the process control computer information regarding the electronic device fabrication environment is obtained. Next, the step of determining a plurality of normalized endpoint values occurs using a plurality of endpoint normalization instructions. The system then tests for completion of a normalization time and, if such time has been completed, the system acquires a plurality of normalized process values associated with the electronic device fabrication process. Then, the method and system apply a plurality of endpoint detection tests to determine the existence of an endpoint in the electronic device fabrication process. Then, the steps of generating an output end signal upon detecting the process endpoint, starting an overetch clock upon the generation of the output endpoint signal occur. An overetch end signal is then generated at a predetermined point in time after starting the overetch clock. Once the process control computer realizes that an overetch end signal has been generated, the ongoing process steps for the electronic device fabrication process terminate.

The present invention has application for a wide variety of electronic devices, for example, for semiconductor wafers, semiconductor memory devices, and CD-ROM and similar types of devices that may be formed within an electronic device fabrication reactor. By virtue of the go-no-go signal process, the endpoint detection process, and the improved sensing of radio frequency power parameters to the process environment, meaningful statistics concerning the plasma process environment may be generated. This improved control makes a significantly greater amount of process economy and flexibility possible. In fact, the precision of plasma processing that the present invention provides makes statistical process control (SPC) feasible for a wide variety of electronic device fabrication processes. For example, another aspect of the present invention is the use of linear regression techniques, such as stepwise linear regression modeling, that generates statistics relative to the plasma processing environment. These statistics make possible modeling of the plasma process environment within the fabrication reactor process chamber meaningful for generating process control models. These models may be used to significantly increase process uniformity for electronic devices.

Other aspects of the present invention include the use of radio frequency harmonic measurements for measuring the voltage, current, and phase angle of the radio frequency power into the plasma process load for electronic device process environment. By sensing harmonic values for voltage, current, and phase angle of the radio frequency power, it is possible to detect and control shifts in these radio frequency power parameters to even more precisely control the generation of radio frequency power during the plasma process. The present invention further uses, in one aspect, a closed loop automatic gain control feature for controlling voltage, current, and/or phase so that voltage, current, and/or phase angle signals are measurable and used for precise process control.

The present invention provides numerous technical advantages that overcome limitations existing in known methods and systems for monitoring and controlling the plasma environment within a fabrication reactor. One technical advantage of the present invention is the ability to monitor radio frequency power at the load of the radio frequency power generator. By determining the radio frequency power that the plasma environment actually sees, as opposed to the radio frequency power at the output of the radio frequency generator, a much more precise measurement of the radio frequency power into the plasma environment is obtained. This may make it practical to place the radio frequency generator remote from the fabrication reactor and even outside the clean room.

Another technical advantage of the present invention is that it improves the impedance matching of the electronic circuit that includes the plasma process. By measuring not only the discharge between the two electrodes in the process chamber, but also sheath impedances, the chuck and wafer impedance, the primary ground path impedance, and the secondary ground path impedance, the present invention provides a much more accurate measure of the resistive and reactive loads that the radio frequency power generator sees. This permits much more precise matching of the impedance. This also improves the overall operation of the present system.

Another technical advantage of the present invention is that in measuring the radio frequency power to the plasma process chamber the present invention treats radio frequency power as a three-dimensional quantity consisting of voltage, current, and phase angle as opposed to the one-dimensional quantity that conventional systems measure. As such, the present invention improves the ability to control the radio frequency power to the plasma environment in a way that improves the repeatability of plasma processes.

Still another technical advantage of the present invention is that by providing functions such as go-no-go control, endpoint detection automated control, and statistical process control based on statistical models, the present invention generally improves the fabrication yields for any given plasma process.

Still a further technical advantage of the present invention is that by analyzing the harmonic amplitudes of voltage, current, and phase angle of the radio frequency power into the plasma process environment, the present invention provides a truly unique opportunity to establish real-time process optimization mechanism. The present invention provides the user with the ability to teach the plasma process or metrology system of the fabrication reactor an acceptable level of process performance to improve manufacturing process control for the electronic device.

BRIEF DESCRIPTION OF THE DRAWINGS

For a more complete understanding of the present invention and the advantages thereof, reference is now made to the following description which is to be taken in conjunction with the accompanying drawings in which like reference numerals represent like features and wherein:

FIGS. 18A and 18B show an inductive coupler and a voltage sensor, respectively, of the present embodiment;

FIG. 20 illustrates process control sensing that the present embodiment makes possible with respect to the various stages at plasma etch process of FIGS. 19A, 19B and 19C; and FIGS. 21 through 33 show results associated with an exemplary application of the present embodiment.

DETAILED DESCRIPTION OF ILLUSTRATIVE EMBODIMENTS

Preferred embodiments of the present invention appear in the Figures where like numerals are used to refer to like and corresponding parts of the various drawings.

Aspects of the present embodiment include a spectral analysis technique that is practical for implementation in an electronic device fabrication environment and the control steps that use the improved process parameter measurement, such as endpoint detection, real-time statistical process control (SPC), and immediate go-no-go or halt signal processing. In addition, the present embodiment incorporates the concept of measuring the full load impedance for the process environment to more precisely sense changes in the plasma process environment.

Figure 1:
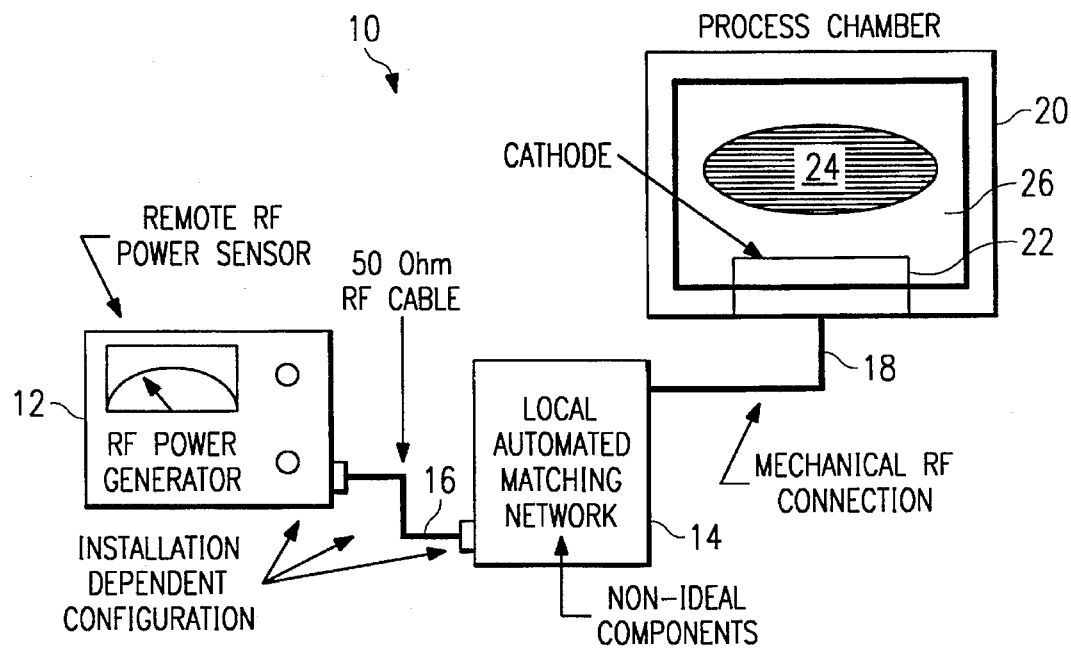
FIG. 1 illustrates the radio frequency network for establishing a plasma process environment within an electronic device fabrication reactor.
Figure 2:
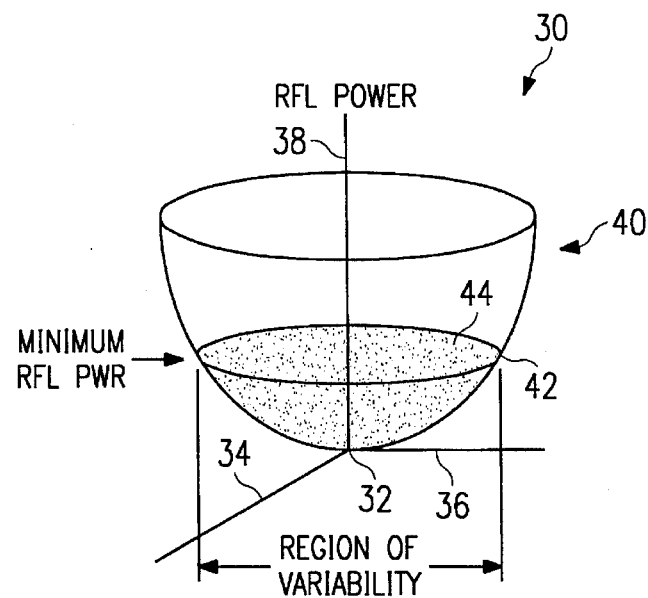
FIGS. 2 and 3 illustrate, respectively, theoretical and actual variations in radio frequency power component measurements for a given radio frequency power to the plasma process environment.
Figure 3:
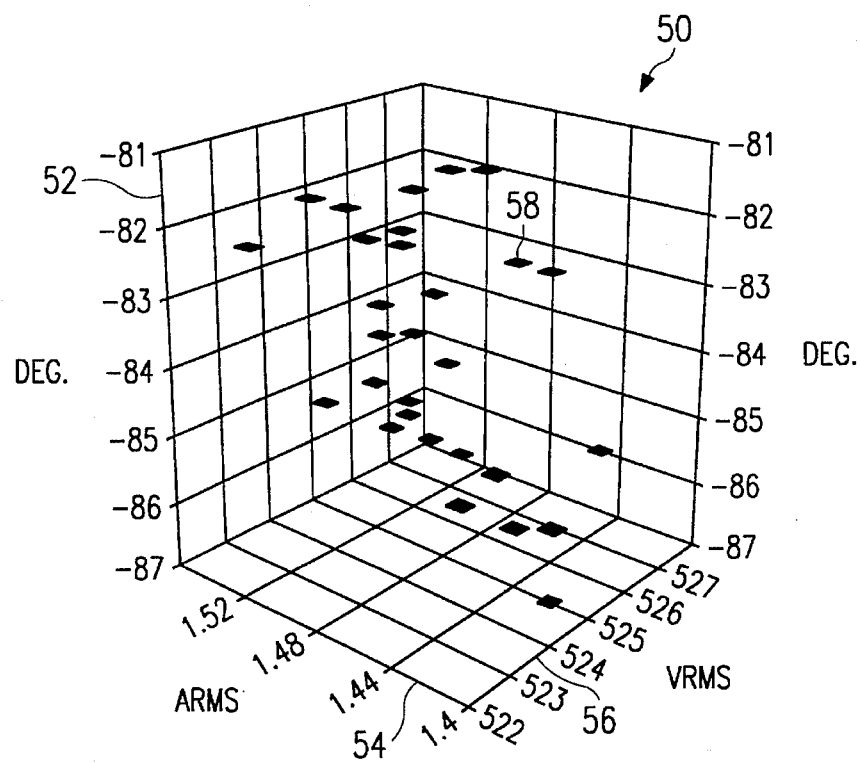
Figure 4:
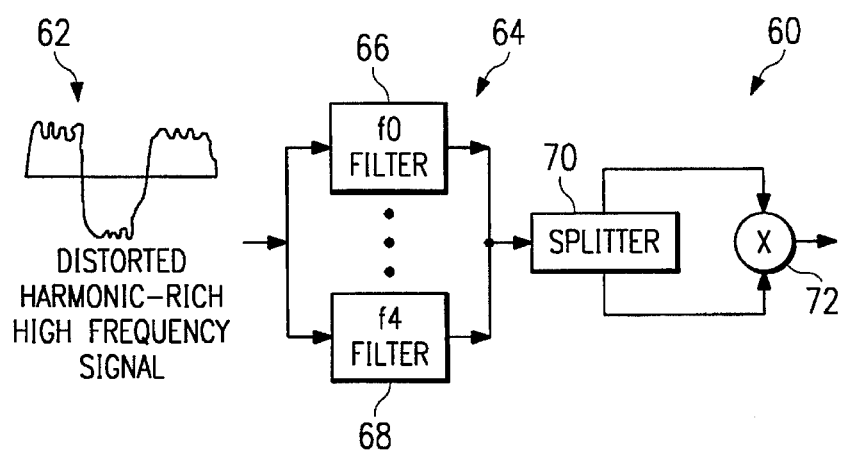
FIG. 4 illustrates a spectral analysis technique that the present invention offers.

The present embodiment is process-driven. As a result, measurements are made for the purpose of improving the process that takes place within plasma environment 24. Turning to FIG. 4, therefore, spectral analysis flow diagram 60 shows distorted harmonic-rich high frequency signal 62 that the present embodiment passes through a spectral filter network 64 including f0 filter 66 and other frequency filters shown elliptically through to f4 filter 68, for example. From filter network 64, signal 62 goes to splitter network 70 which feeds mixer 72. The signal flow of FIG. 4 illustrates a practical technique for making radio frequency power measurements for the radio frequency power flowing to the plasma process environment.

The signal that comes from the radio frequency plasma is analogous to that from an FM radio signal. Radio frequency power generator 12, for many plasma processes, generates a 13.56 MHz signal that has few or no harmonic signals. Since the radio frequency signal that reaches the sensors of the present embodiment are measured at the load, there is at that point a non-linear portion that has already shifted some of the radio frequency energy from the signal. This produces the distorted harmonic-rich frequency signal 62 of FIG. 4. This basic sine-wave shape, therefore, generates distorted results. The f0 filter circuit 66 on through f4 filter circuit 68 are band pass filters that are selective to the harmonic frequencies of the fundamental frequency of interest (e.g., 13.56 MHz). Splitter 70 permits selection of the filter circuit output. Consequently, in the circuit of FIG. 4, splitter 70 output goes to multiplexer 72 at the selected harmonic frequency, e.g., 13.56 MHz, 27.12 MHz, 40.68 MHz, 54.24 MHz, or 67.80 MHz. Because of the filter circuit selectivity, the signal that goes to multiplexer 72 is a clean sine-wave signal. A simple magnitude detector, such a peak detector or RMS detector circuit may then be used to determine the magnitude of the signal.

The method of FIG. 4 overcomes methods based on digital signal processing (DSP) techniques. DSP-based methods take the radio frequency power signals to a Fast Fourier transform (FFT) algorithm contained in a DSP unit. For certain applications, such as research and development, where one-time measurements are normal, this method could be the technique of choice. However, if the measurement is to replicated, variability due to the nonlinear components of the technique may cause significant errors and even failure of the technique due to unacceptable measurement performance.

The process of FIG. 4 also is superior to nondirectional coupler technology for radio frequency signal measurements. Many matching circuits currently employ directional coupling technology to make one-dimensional forward and reflective power measurements. The object of directional coupler technology is to sample the radio frequency wave form as it travels through a coupler device. The sampled wave form is then directed to some detector technology. The detector technology can vary from a simple square law device to a much more complex spectrum analyzer. The inherent broad band nature of directional couplers and the fact that any detector will be subject to the first spectrum of incidental radio frequency signals pose limitations on this technique. The broad band nature limits the type of information derivable by the directional coupler technique, because traditional detectors have no ability to frequency discriminate. This causes a loss of all information that is contained in the load's harmonic signature. As such, the directional coupler technique may reduce to only a one-dimensional measurement capability for the radio frequency power.

Process 60 of FIG. 4 incorporates the desirable attributes of both the FFT method and the directional coupling method to provide a process that inherently discriminates both forward and reflected power, as well as frequency components. By implementing the FFT in hardware so as not to degrade the signal by front end DSP-based signal processing, while at the same time deriving a "net" radio frequency current delivered to the load without convoluting the frequency information, it is possible to significantly improve the radio frequency power measurement in the plasma environment. Process 60 in FIG. 4 provides the capability to frequency discriminate the components of radio frequency power, including voltage, current, and phase, so that a complete picture of the radio frequency load may be established and used with whatever precision is necessary for manufacturing process control. By filtering the radio frequency signals prior to detection, process 60 results in distortion-free harmonic measurements. These harmonic measurements permit a detailed understanding of the relationship between the object being measured (i.e., the broad band radio frequency voltage, current and phase) and the entity being controlled from the measurements (i.e., the plasma process).

The present embodiment employs radio frequency harmonic analysis for the purpose of determining endpoint detection, statistical process control, and the existence of a go-no-go situation that may indicate an out-of-control process. The advantage of using harmonics is that there is no dead band process control or tapering off in the measurements that result. This provides the most rapid or instantaneous process control for any plasma processing environment. The present embodiment analyzes harmonic amplitudes and matches them to known good historical values using the simple mathematical algorithm. The parameters that the present embodiment employs permits modeling of plasma process parameters that can relate to stress, thickness, deposition rate and other parameters.

Figure 5:
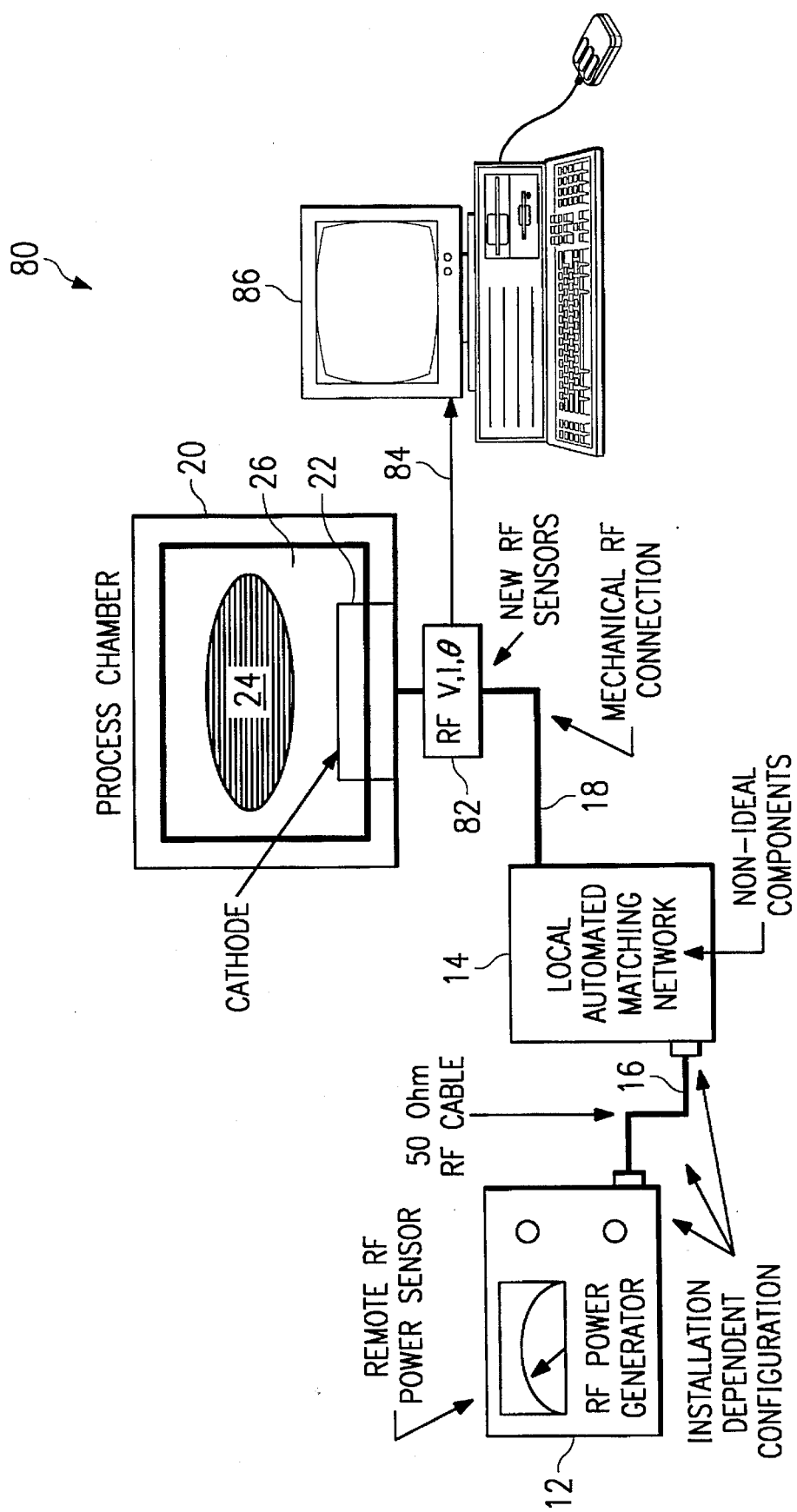
FIG. 5 illustrates the radio frequency network of the present embodiment.

FIG. 5 shows the implementation of the present embodiment in radio frequency network 80 for significantly improving plasma process control. In radio frequency network 80 of FIG. 5, radio frequency power generator 12 supplies local automated matching network 14 of radio frequency power through cable 16. Local automated matching network 14 provides radio frequency power through mechanical radio frequency connection 18 to process chamber 20. Within process chamber 20 are cathode 22, plasma environment 24, and plasma sheath 26. Sensors 82 provide, through connection 84, radio frequency's voltage, radio frequency, current, and phase angle information to process control computer 86. Process control computer 86 includes the necessary instructions for achieving endpoint detection, real-time SPC, and immediate go-no-go functions for the plasma gas 24 environment of process chamber 20.

Sensors 82 at the input to process chamber 20 include a voltage probe that the present embodiment places at the point of application of the radio frequency power and references it to ground. As a consequence, if any of the voltage dropped across the load changes these changes appear as a change in the voltage of the radio frequency power into the cathode 22 that produces the plasma. Similarly, an inductive pick-up (see FIG. 18) wrapped around a primary radio frequency current carrier senses the current of the radio frequency power going into process chamber 20. Thus, if anything changes in the radio frequency load, such as the clearing off of a film of a wafer or a changing of a gas mixture, the voltage and current will change. The changes may be very subtle, such as unintentional changes in a gas mixture or an unintentional clearing off of a film on the electronic device. It could be, for example, polymerization of the chamber wall or the wearing away of anodization coatings on various process chamber components. Since the radio frequency load is closely coupled to the current and voltage as well as the phase angle, due to capacitive and inductive effects, these changes will affect the plasma environment in the process chamber.

Figure 6:
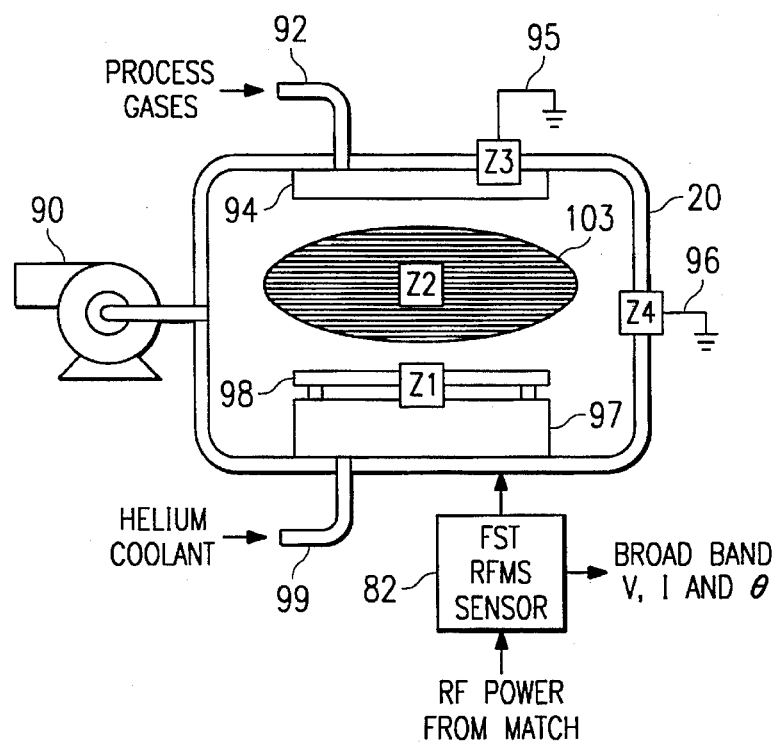
FIG. 6 shows the full load measurement characteristics of the present embodiment.

FIG. 6 shows process chamber 20 in a way to illustrate the radio frequency loads that the present embodiment considers in determining the full radio frequency load to the radio frequency power from radio frequency power generator 12. In particular, process chamber 20 has connections that include vacuum pump connection 90 that removes from process chamber 20 process gases and spent plasma gasses. Gas input 92 connects to plasma sheath 94 and provides process gases into process chamber 20. Sheath 94 connects to ground 95 to form a primary ground path impedance. In addition, ground connection 95 connects to process chamber 20 to form a secondary ground path impedance. Chuck 97 and wafer 98 form a further radio frequency load impedance with process chamber 20. Connecting to chuck 98 may be a helium-cooled inlet 99 and a connection to sensor suite 82 of the present embodiment. Furthermore, plasma discharge environment 103 forms yet another radio frequency load impedance to the radio frequency power, In summary, the impedances for the radio frequency plasma generation process include the chuck and wafer impedance, Z1, the discharge and sheath impedance within process chamber 20, Z2, the primary ground path impedance, Z3, and the secondary ground impedance, Z4. The present embodiment, therefore, realizes the existence of a full radio frequency load that includes various chamber components such as the wall chemistry, the plasma discharge, and the wafer itself. As a result, the present embodiment makes possible resolving each of the impedances at the power electrode by isolating the radio frequency power voltage, current and phase angle measurement associated with a particular impedance. This makes it possible to identify which factors contribute to shifts in the overall radio frequency load of the radio frequency network.

Figure 7:
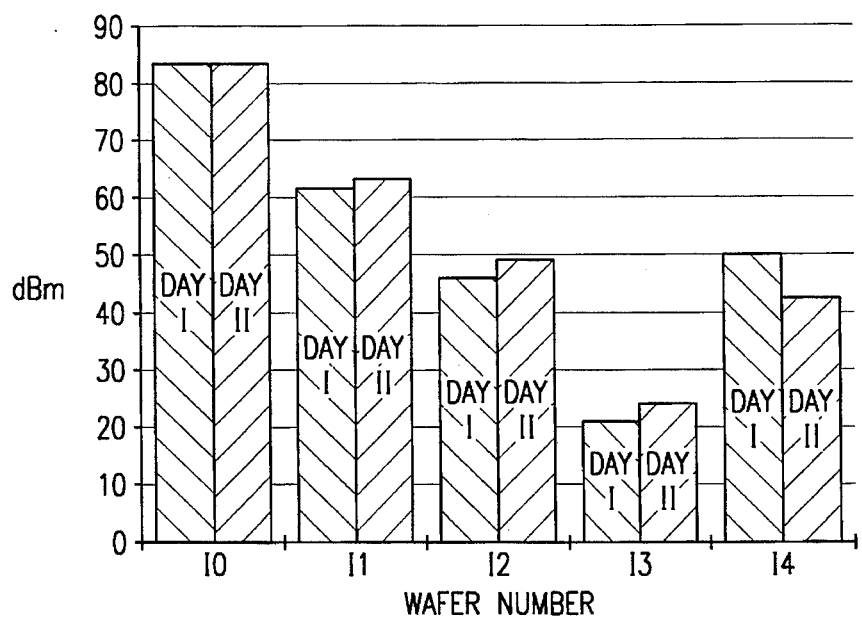
FIG. 7 illustrates the go-no-go decision support that harmonic signature analysis of the present embodiment provides and makes possible.
Figure 9:
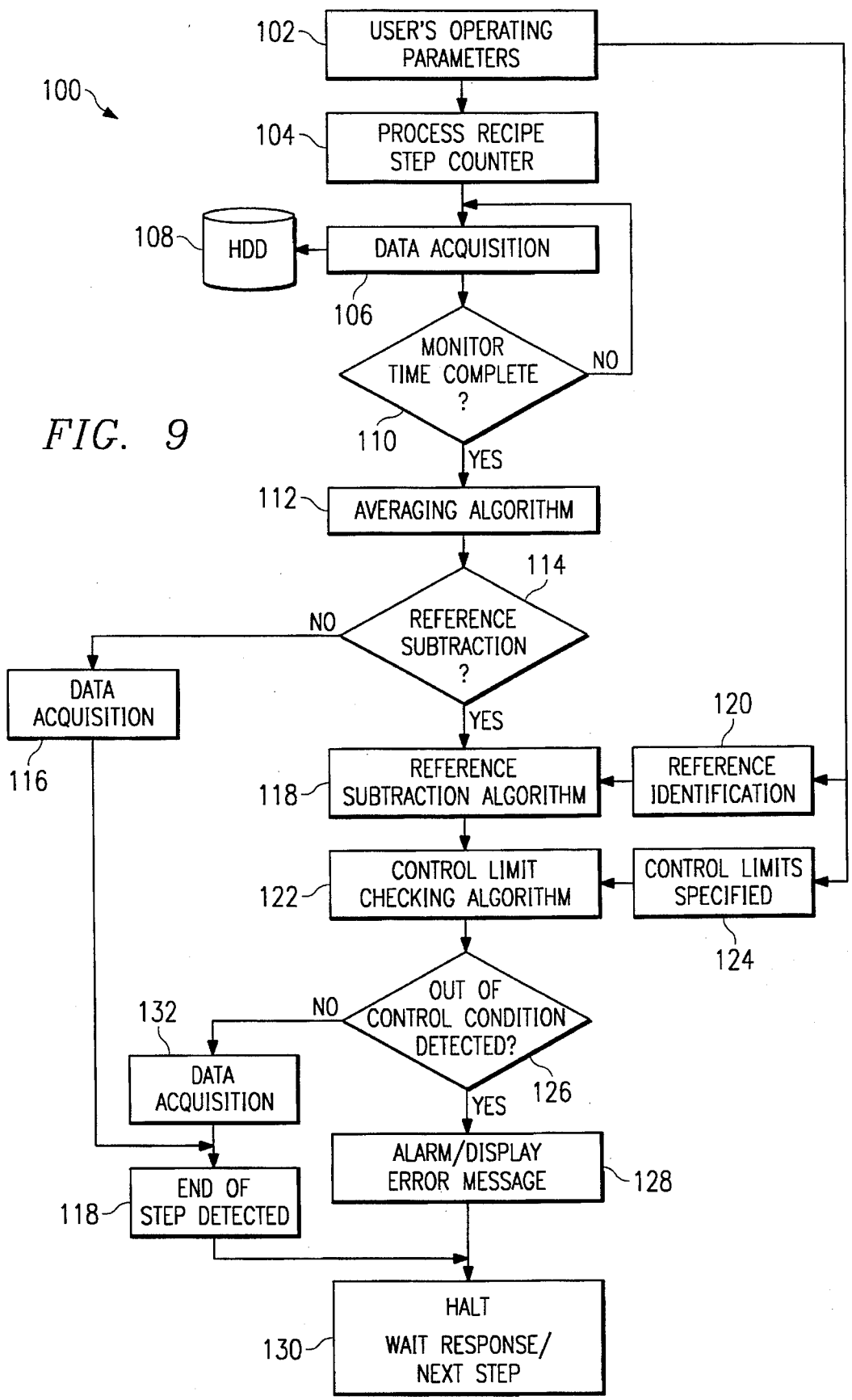
FIG. 9 depicts the go-no-go detection process flow of the present embodiment.

The harmonic signature-based go-no-go decision support capability importance is shown in FIG. 7. In the example of FIG. 9, the current harmonics are labelled I0 through I4. The largest shift in I4 provides an immediate indication of a process shift. This deviation is created by a shift in the complex impedance of the radio frequency load.

Figure 8:
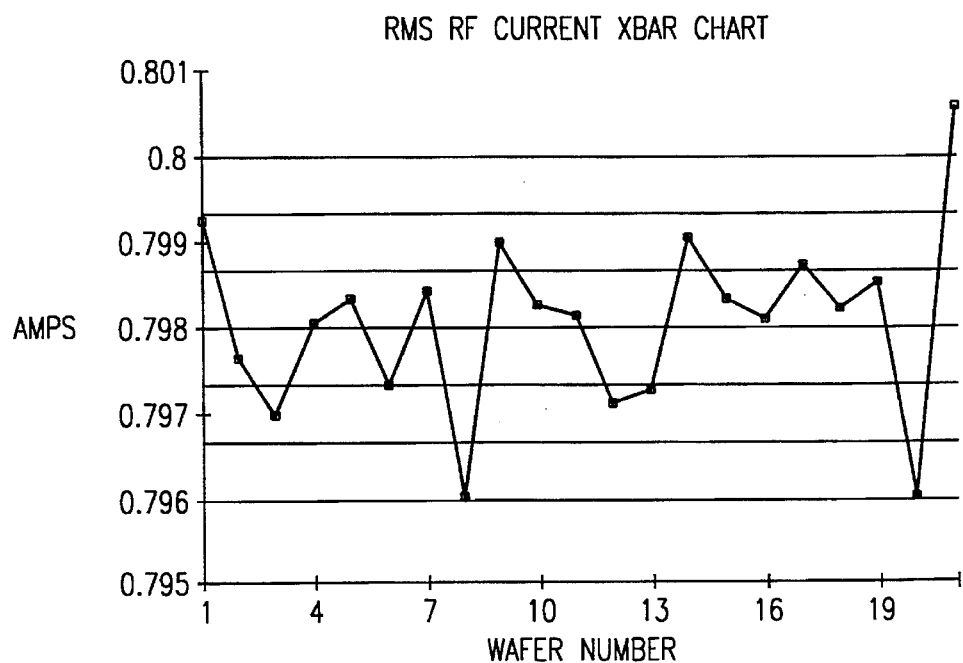
FIG. 8 illustrates the variation in current between individual semiconductor wafers to illustrate the variability in statistical process control that the present embodiment makes possible.

FIG. 8 detects the wafer-to-wafer SPC capability that the present embodiment makes possible. Common throughout the semiconductor industry is the use of endpoint (i.e., end of process) traces and SPC "X-bar" charts. Based on the understanding of process correlation to measurement capabilities and the common acceptance of output formats, the complex radio frequency measurement that the present embodiment makes possible may be made both transparent and acceptable to the end user. In addition to the traditional endpoint and X-bar applications, the analysis of harmonic amplitudes provides a truly unique opportunity to establish a real-time process optimization tool. By providing the user with the ability to teach the metrology system the acceptable level of process performance, the present embodiment makes possible a go-no-go decision support capability. The essence of the go-no-go or halt process decision support capability to autonomously, and in real-time, evaluate process optimization and halt the operation on the semiconductor or electronic device should a predetermined out-of-control condition be detected.

FIG. 9 shows in more detail the go-no-go detection process flow 100 that the present embodiment employs. Beginning at block 102 a user inputs operating parameters. Then, at block 104, process recipe step counter begins. Data acquisition begins at block 106 and data is stored in a hard disk drive 108 associated with, for example, process control computer 86. The next step is to test whether the monitored time has been completed as query 110 indicates. If the monitored time is not complete, process flow returns to data acquisition block 106. If the monitored time is complete, process flow continues to block 112 where an averaging algorithm for the data is employed. After performing the averaging algorithm on the process parameters, the next step is to determine whether reference subtraction is called for in go-no-go detection flow 100, as query 114 indicates. If reference subtraction is not called for, data acquisition continues as block 116 indicates until an "end of step" signal occurs according to block 118. If a reference subtraction signal or instruction is present, process flow goes to reference subtraction algorithm 118. Reference subtraction algorithm 118 receives reference identification information which was originally input by the user, as block 120 illustrates. After operation of the reference subtraction algorithm, process flow continues to block 122 where specific control limits, which may be input by a user, are used, as block 124 depicts. After operating control limit checking algorithm, process flow proceeds to out-of-control condition detected query 126, whereupon, based on the operation of reference subtraction algorithm 118 and control limit checking algorithm 122, an out-of-control condition may be detected. If an out-of-control condition exists, then an alarm or display error message is generated by process flow 100, as block 128 illustrates. If an alarm or display message is generated, then process flow proceeds to block 130, where a halt or wait response until the next step signal is generated. This point may also be reached through end of step detected signal 118 which received an input from data acquisition block 116 or data acquisition block 132.

In the go-no-go detection process flow 100 of FIG. 9, after the initialization steps of inputting user operating parameters in block 102 and process recipe step counter definitions in block 104 occur, data acquisition begins as block 106 indicates. In the go-no-go detection process flow 100, a monitor time signal begins upon initialization of data acquisition step 106. The parameters that data acquisition step 106 monitors may be, for example, (1) an entire voltage spectrum including the fundamental frequency and four harmonic frequencies, (2) the fundamental current frequency and four harmonic frequencies, (3) both the fundamental voltage and current frequencies and four harmonics of each of these frequencies, or (4) the combination of all voltage frequencies and all current frequencies together with monitoring the phase angle between the voltage and the frequency. In other words, the present embodiment may monitor, for example, five voltage frequencies, five current frequencies, ten signals representing all the current frequencies and all of the voltage frequencies, or eleven signals representing all current and voltage frequencies together with the phase angle information from the radio frequency radio frequency power into the radio frequency load.

Averaging algorithm 112 takes a rolling average over the monitoring time designated by the user operator parameters in block 102. This is a simple, numerical average that is next used in the event that referenced subtraction signal query 114 indicates that a reference subtraction instruction in the user operator parameter input from block 102.

An important aspect of the present embodiment is that it generates through data acquisition step 106, data files that are stored in hard disk drive 108 that is unique down to 1/100th of a second for a given day. This permits a user to select a particular wafer, of a particular lot, on a particular day if necessary to determine information about the wafer manufacturing process.

Based on the information that the present embodiment provides, a manufacturer of electronic devices may identify changes in a process that are the result of changes in the data that data acquisition step 106 generates. This permits linear progression or other modelling of processes for the purpose of determining whether an out-of-control condition exists. For example, as the X-Bar chart of FIG. 8 indicates, RMS radio frequency current generally hovers around an exemplary current value of 0.798 amps. Using known statistical process control and rules relating to the XBar charts, it may be determined, for example, that a beyond three sigma difference from the value of 0.798, in this example, indicates a problem in the fabrication process. This type of information is obtainable using the information that the present embodiment provides. Thus, in the example of FIG. 8, more than a three-sigma difference exists between wafer 20 and wafer 21. This difference would indicate that an out-of-control condition exists. This out-of-control condition would indicate further that there is the need to halt the fabrication process to identify and resolve the out-of-control condition.

The go-no-go algorithm of FIG. 9 also would provide to the user meaningful data concerning the harmonic information from the chart of FIG. 7. Note, in FIG. 7, that the signals I0 through I4 represent bar chart values for dBm for the frequency values that the present embodiment senses and measures. The bar chart of FIG. 7 shows bars for two different days in the frequencies of the fundamental frequency, I-O, ranging to the four harmonic frequencies, I1 to I4. Note that there is a relatively uniform variation between the dBm values for the wafers measured on Day I, when compared to that of the data taken on Day II. This is true except for the data taken for the fourth harmonic, I4. The I4 harmonic shows that the Day I data has a greater value than does the Day II data. This difference between the trend exhibited by the three harmonics, I1 through I3, shows a problem or anomaly in the process information. As a result, go-no-go process flow 100 may just be controlled to define this as an out-of-control condition. Go-no-go process 100 may then use this to indicate to an operator the need to halt the fabrication process until this difference either goes away or is resolved to the satisfaction of the electronic device manufacturer.

Figure 10:
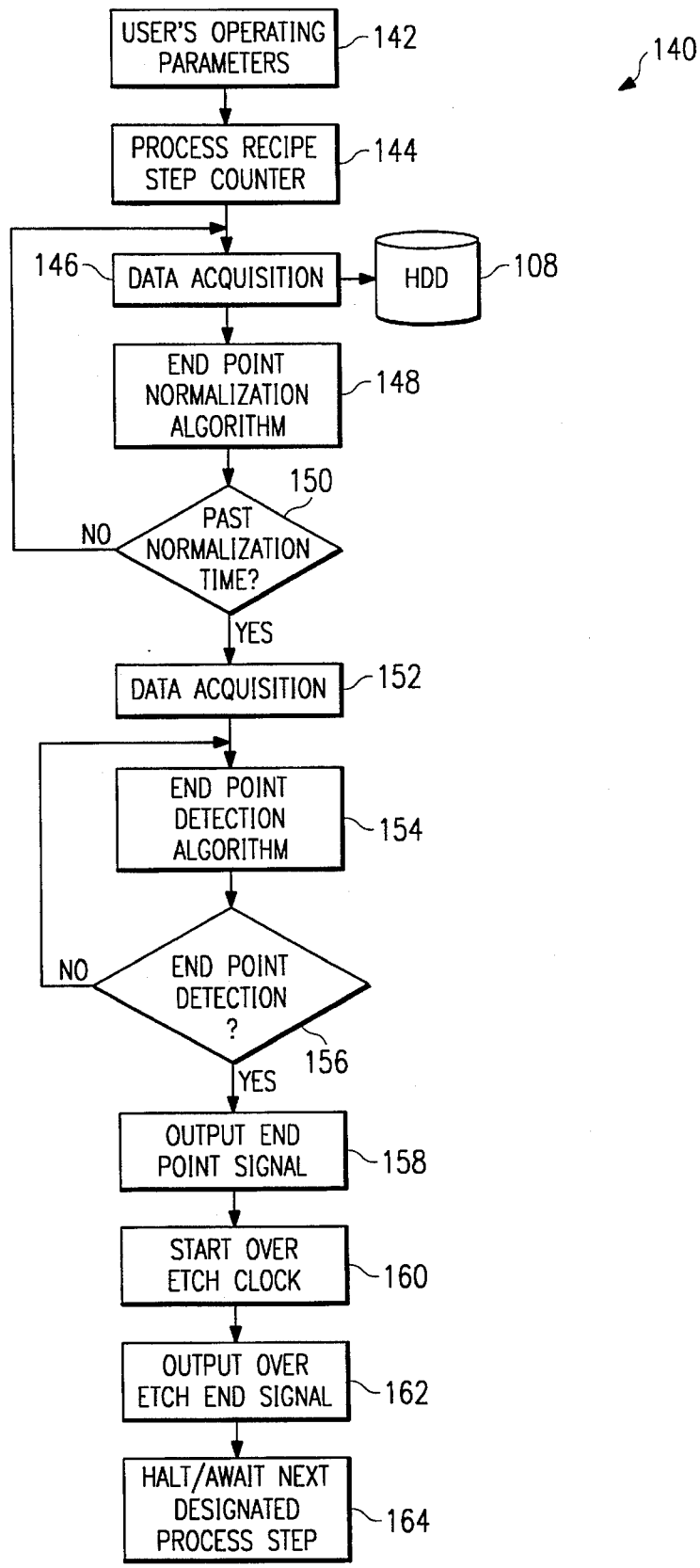
FIG. 10 illustrates the endpoint detection process flow of the present embodiment.

FIG. 10 shows the endpoint process flow diagram 140 of the present embodiment. Beginning at block 142 a user may input operating parameters. The next step in process flow 140 is to initiate a process recipe step counter at block 144. Process flow proceeds to data acquisition block 146, at which point data respecting the plasma process is acquired and stored in hard disk drive 108. Data acquisition continues until process flow 140 goes to endpoint normalization algorithm 148. After operating endpoint normalization algorithm 148, process flow goes to pass normalization time query 150. If the process has not continued past the normalization time, then process flow returns to data acquisition block 146. If the process has continued past the normalization time, then process flow proceeds onward to data acquisition block 152, where further process data is required for the operation of endpoint detection algorithm 154. Following the operation of endpoint detection algorithm 154, process flow 140 tests whether an endpoint is detected at query 156. If no endpoint is detected at query 156, then process flow returns to endpoint detection algorithm 154. If endpoint detection does occur, then process flow proceeds to output endpoint signal block 158. Block 158 generates a signal that triggers the overetch clock, as start overetch clock block 160 depicts. Process flow then proceeds to block 162 at which the output overetch end signal is generated. Process flow then goes to halt/await next designated process step state 164.

In further describing endpoint process flow diagram 140 of FIG. 10, a user may enter a setup screen or package that allows selection a desired endpoint algorithm. The algorithm may be a slope detection or level change algorithm. A slope detection algorithm may, for example, be a positive slope or negative slope algorithm or a threshold signal detection algorithm for detecting particular a threshold parameter or algorithm for processing the electronic device. This occurs at block 142. In process recipe step counter block 144, the user further describes the process that endpoint process 142 is to monitor. For example, by designating the number of radio frequency signal on/off steps that are in a particular manufacturing recipe. A typical scenario may be, for example, a three-stage process that includes (1) an initialization stage, (2) a bulk etch stage, and (3) an over etch step or process that is a time dependent stage. For a particular electronic device, the recipe may be repeated numerous times to fabricate an electronic device. All of this information is part of the initialization of the endpoint detection algorithm.

After initialization, the next stage beings by acquiring data, as block 146 illustrates, and from this part of the data determine whether the operation has reached a normalization time as query 150 illustrates. After passing the normalization time, endpoint detection process 140 begins looking for one or more changes in the fabrication process data. For example, endpoint detection algorithm 154 may look for a slope change or a level change or some other change in the sensed parameters. This is an autonomous mode of operation that signals that the process has reached an endpoint. After endpoint detection query 156 determines that an endpoint has been reached, process flow 140 continues to output end point signal block 158 which generates an end point signal for inducing a step change in the operation of the fabrication reactor.

In the above-described three-step process, if initialization step begins the first stage, and the data acquisition step begins the second stage, then the third stage begins upon generating the output end point signal. In this third stage, an over clock begins to operate, as start over clock block 160 depicts. After outputting the over end signal according to block 162, process flow 160 goes to halt/await next designated process step block 164.

Additional embodiments of the process flow that FIG. 10 depicts may include the use of a second or additional algorithm as part of a four-stage process. For example, as opposed to the three-stage process, the four-stage process may include (1) an initialization stage, (2) a bulk etch stage, (3) a second bulk etch stage, and (4) the third or ending stage. As in the end point detection process flow 140 of FIG. 10, the second bulk etch stage end point may also be a level change, a slope change, or something else, even for example, a Fast Fourier Transform (FFT) algorithm at which a particular result will determine the end of that stage and the need to transition to the fourth stage.

Another alternative embodiment of the point process flow 140 of FIG. 10 may be to apply linear regression modelling to achieve desired deposition rates or other process parameters by which a user may sense the operation of the model and compare it to the operation that actually takes place within process chamber 20.

Figure 11:
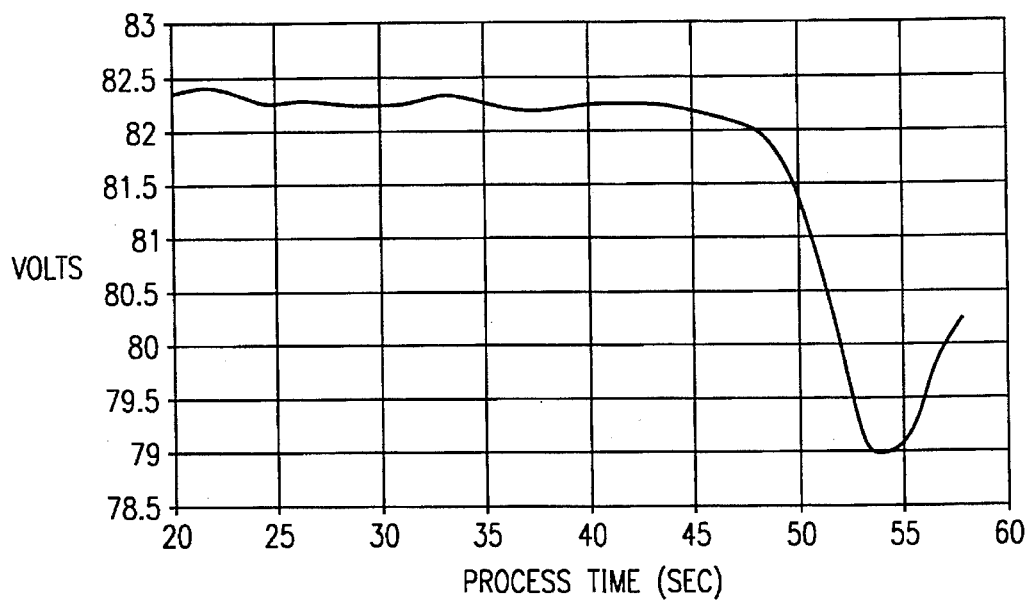
FIG. 11 depicts the endpoint capabilities that the present embodiment makes possible as a result of the increased sensitivity and speed of process parameter detection.

FIG. 11 depicts a typical process curve that results during a fabrication process. Note that at a process time of approximately 54 seconds a dip in the volts to a level of approximately 79 volts occurs. This dip indicates the endpoint of a fabrication process such as that for which block 156 of flow process 140 tests.

Figure 12:
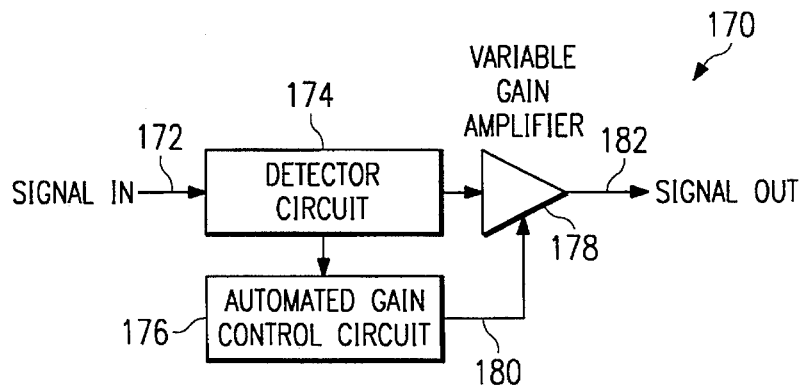
FIG. 12 illustrates a Circuit "A" component of the present embodiment for the automated gain control function.

FIG. 12 illustrates a circuit component, herein referred to as Circuit "A", that forms a building block of the sensing and measuring circuitry of the present embodiment. Circuit "A" forms an automated gain control circuit 170 that receives input signal 172 to detector circuit 174. Detector circuit 174 provides an output to automated gain control circuit 176 and an output to variable gain amplifier 178. Automated gain control circuit 176 compares the output from detector circuit 174 to produce a control signal 180 for variable gain control amplifier 178. Variable gain control amplifier 178 then outputs a control output signal 182 that may be used by other circuitry within the present embodiment.

Figure 13:
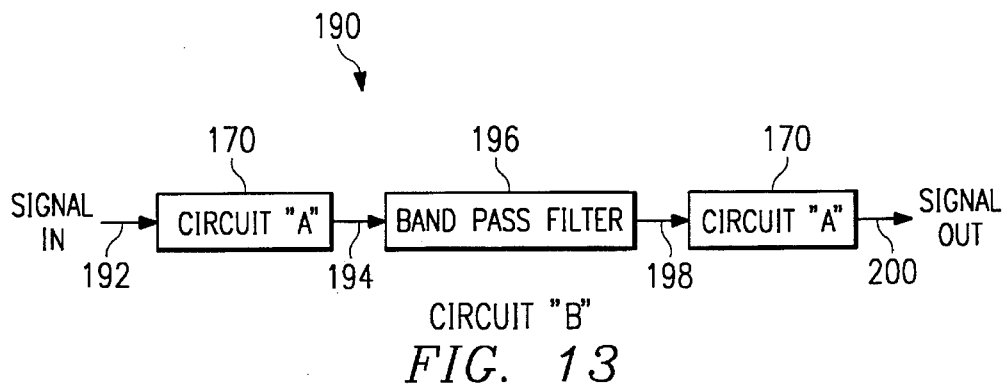
FIG. 13 illustrates the Circuit "B" band pass filter circuitry of the present embodiment.

FIG. 13 shows a band pass filter circuit 190 that also forms a building block of the circuitry of the present embodiment, herein referred to as a Circuit "B". In Circuit "B" 170, input signal 192 goes to Circuit "A" 170 that has the function and structure of Circuit "A" in FIG. 12. Circuit "A" 170 produces output signal 194. Output signal 194 goes to a band pass filter 196 for filtering. The output from band pass filter 196 travels as signal 198 to a further building block 170 that performs an automatic gain control function on input signal 198 to produce the output signal 200.

Figure 14:
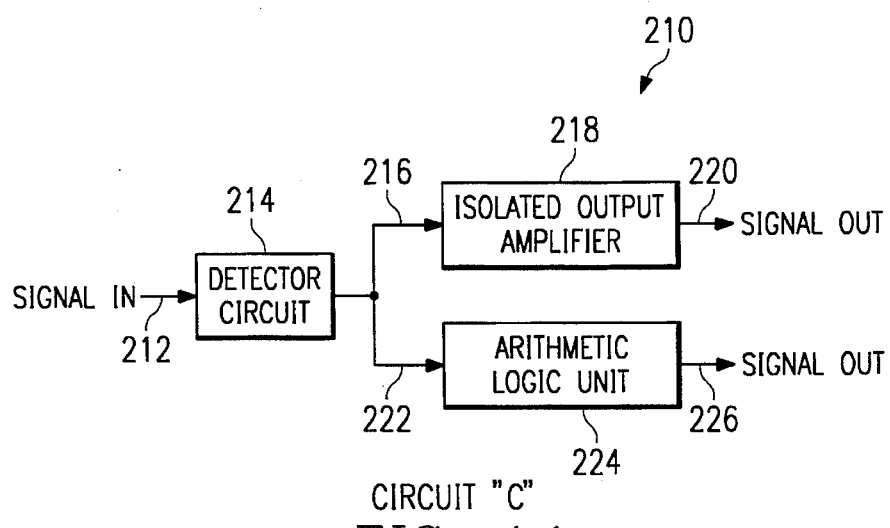
FIG. 14 illustrates the detector circuit and output amplifier and logic operation circuitry that is repeated through the present embodiment as Circuit "C"

FIG. 14 shows still another building block, Circuit "C", of the present embodiment in the form of amplifier and output circuit 210. Amplifier and output circuit 210 receives input 212 at detector circuit 214. Detector circuit 214 produces two parallel outputs. A first output 216 goes to isolated output amplifier 218. Isolated output amplifier 218 produces an amplifier output signal 220 that may be used by other circuitry within the present embodiment. Parallel output 222 from detector circuit 214 goes to arithmetic logic unit 224. Arithmetic logic unit performs desired logic functions on output 222 and produces output signal 226.

Figure 15:
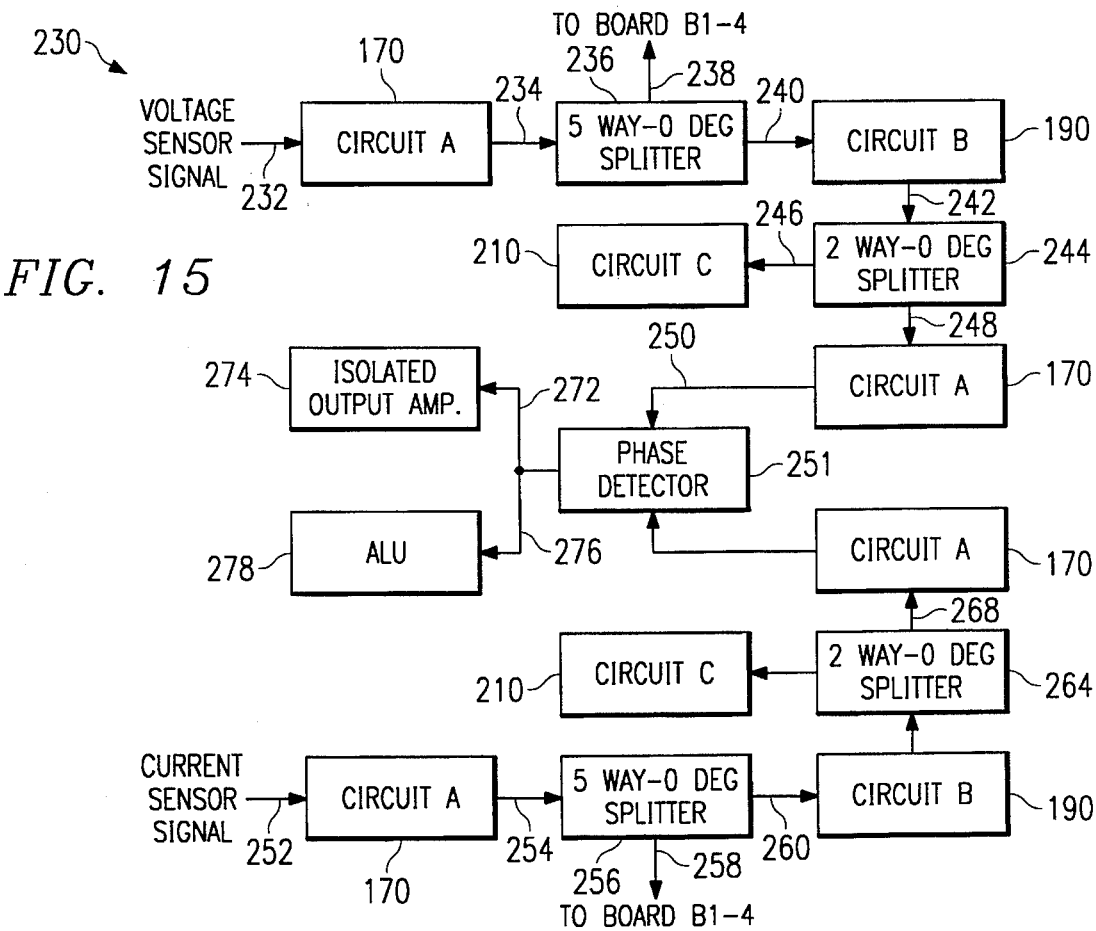
FIG. 15 shows the voltage sensor signal-current sensor signal input circuitry for generating the isolated output amp and arithmetic logic output of the present embodiment.

FIG. 15 shows the basic circuitry of the present embodiment for processing voltage, current, and phase angle measurements of the radio frequency power into process chamber 20. Processing circuitry 230 receives voltage sensor signal 232 that goes to Circuit "A" 170. Circuit "A" 170 provides a gain controlled output signal 234 to 5-way-0 degree splitter circuit 236. The 5-way 0 degree splitter circuit 236 divides input signal 234 into five signals. Four signals go in parallel as output signal 238 to board B1–4 (see FIG. 16). The fifth output signal 240 goes to Circuit "B" 190 for producing an output signal 242. Output signal 242 goes to 2 way-0 degree splitter circuit 244. Signal 246 from 2 way-0 degree splitter circuit 244 goes to Circuit "C" 210. The remaining output signal 248 goes to Circuit "A" 170. Circuit "A" 170 produces output signal 250 that goes to phase detector circuit 251.

B0 circuit 230 of FIG. 15 is symmetrical about phase detector circuit 251. Therefore, current sensor signal 252 goes to Circuit "A" 170. Output signal 254 from Circuit "A" 170 goes to 5 way-0 degree splitter circuit 256. The 5 way-0 degree splitter circuit 256 produces four output signals 258 that go to board B1–4. The fifth signal from 5 way-0 degree splitter circuit 256 goes as output signal 260 to Circuit "B" 190. Circuit "B" 190 produces output signal 262 for 2 way-0 degree splitter circuit 264. The 2 way-0 degree splitter circuit 264 produces output signal 266 for Circuit "C" 210 and output signal 268 for Circuit "A" 170. Circuit "A" 170 generates output signal 270 to phase detector 251. Phase detector 251 detects the phase between voltage sensor signal 232 and current sensor signal 252 to produce parallel output 272 for isolated output end 274 and parallel output 276 for ALU circuit 278.

Figure 16:
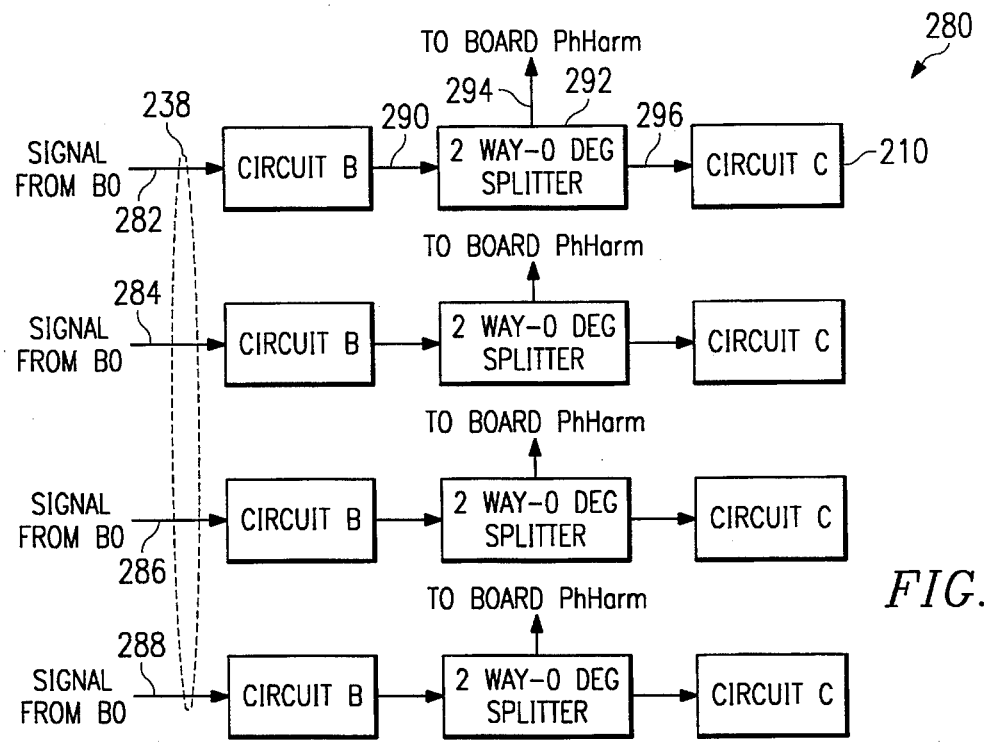
FIG. 16 depicts the B1–4 circuitry for measuring the amplitude of voltage or current signals from the input circuitry of FIG. 15.

FIG. 16 shows block diagrams for each of the signals 238 or 258 from B0 circuit 230 of FIG. 15. In particular, recall that from 5 way-0 degree splitter circuit 236 of B0 circuit 230, four output signals labelled simply as output signal 238 go to board B1–4. Likewise, four outputs signals 258 from 5 way-0 degree splitter circuit 256 of B0 circuit 230 go to an associated board B1–4 for a current measurement. Thus, for example, the four B0 output signals 238 are identified together in FIG. 16 as reaching B1–4 circuit 280 as separate signals 282, 284, 286, and 288. For the following discussion, input signal 282 flow appears. Signal flow for input signals 284, 286, and 288 is similar. Thus, input signal 282 goes to Circuit "B" 190 to produce output 290 that 2 way-0 degree splitter circuit 292 receives. Part of 2 way-0 degree splitter circuit 292 output goes to a phase angle harmonic circuit (see FIG. 17) as output signal 294. The remaining output signal 296 goes to Circuit "C" 210.

Figure 17:
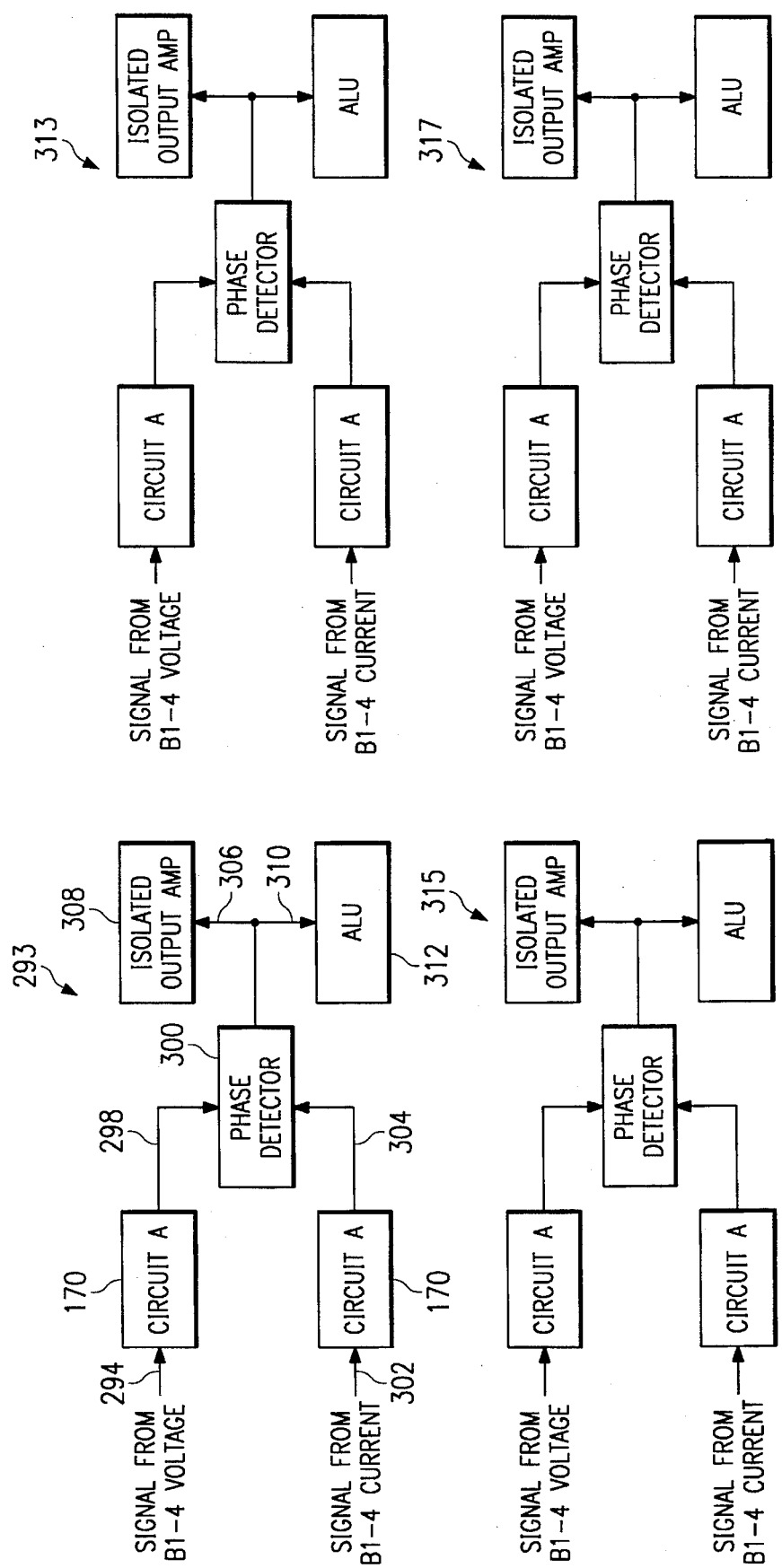
FIG. 17 shows the phase harmonic circuits of the present embodiment for measuring the phase angles of harmonics of the current and voltage signals from FIG. 16.

FIG. 17 illustrates functionally similar phase harmonic detection circuits that permit quantifying the amount of power which is frequency converted by the radio frequency load. This permits more precisely quantifying subtle differences and process hardware and chemistry. This provides the phase angle for the average power calculation. As such, it is possible to show that as the frequency increases, the phase angle becomes more positive. This results in more efficient power transfer at higher frequencies. The benefit of this determination arises from the property that since the load will essentially shift the energy to where it needs the energy to meet user performance requirements, this circuit will permit determining the location of those energy requirements. Thus, if different power levels are being shifted in different tools, the circuitry of FIG. 17 permits identifying and understanding performance variability on a tool-to-tool basis. Thus, referring to FIG. 17, output signal 294 from 2 way-0 degree splitter circuit 292 (FIG. 16) goes to Circuit "A" 170, which produces output signal 298 to phase detector 300. Likewise, from the similarly constructed output of the current B1–B4 circuit, signal 302 goes to Circuit "A" 170 to produce output signal 304 to phase detector 300. Phase detector 300 produces a parallel output having component 306 to isolated output amplifier 308 and output 310 to arithmetic logic unit 312. The output of each of these circuits provides meaningful data regarding the plasma process.

In the present embodiment, one of these circuits exists for each of these possible harmonic frequencies that may exist in the plasma process. For example, if the fundamental frequency is 13.56 MHz, circuit 293 of FIG. 17 may be the circuit for 13.5 MHz operation. Circuit 313 may represent a circuit determining the output for a 40.68 MHz output from the radio frequency plasma. Circuit 315 may represent a phase harmonic circuit for a 54.24 MHz harmonic signal.

Circuit 317 may represent the 67.80 MHz phase harmonic circuit.

FIG. 18a shows a unique aspect of the present embodiment in the form of toroidal inductor device 320 for measuring the radio frequency current into the radio frequency load. Toroidal inductor device 322 includes a toroid-shaped inductor 322 within casing 329 that provides direct coupling and measurement of the parameters for the plasma as they enter process chamber 20. Toroidal inductor device 320 inductively couples with the radio frequency energy into the discharge to produce a current signal that is representative of the current that enters process chamber 20. The output from toroidal inductor 322 goes to output 326. This provides direct measurement of the radio frequency current process variables. The signal from toroidal inductor device goes to input circuitry 230 of FIG. 15.

Another interesting aspect of the present embodiment is voltage sensor 321 of FIG. 18b that includes voltage two resistors 323 in casing 325 of size and function similar to that of casing 324 for toroidal inductor device 320. Resistors 323 drop the voltage by a known factor and direct it also to input circuitry 230 of FIG. 15. The voltage that comes from the voltage sensor 321 is an accurate scaled measurement of the actual voltage into process chamber 20.

The signal that comes from the radio frequency plasma is analogous to an FM radio signal. The generator puts out a very clean radio frequency signal often at a frequency of 13.56 MHz. Since the signal coming to the sensors of the present embodiment is measured at the load, at that point there is a non-linear load element that has already shifted some of that radio frequency energy from the 13.56 MHz, for example. This produces the distorted harmonic-rich frequency signal 62 of FIG. 4. The basic time-wave shape has distorted results. The output from splitter 70 goes to multiplexer 72 and based on the output select signal whether from f0 filter 66 or f4 filter 68 or somewhere in between, an output signal, for example, up to a frequency of five times the fundamental is possible. The filters 66 through 68 are band pass filters. As a result, what comes from the filters is a clean sign wave at the band of the filter frequencies. From that point, a simple magnitude detector may be employed to determine the magnitude of the signal. By using a peak detector circuit with significant sensitivity, it is possible to obtain accurate measurements of the voltage and current coming from the various sensors.

OPERATION

The above description makes operation of the present embodiment apparent, and the following discussion describes in still further detail how the components and parts cooperate with one another to achieve the technical advantages of the present invention.

Figure 19A:
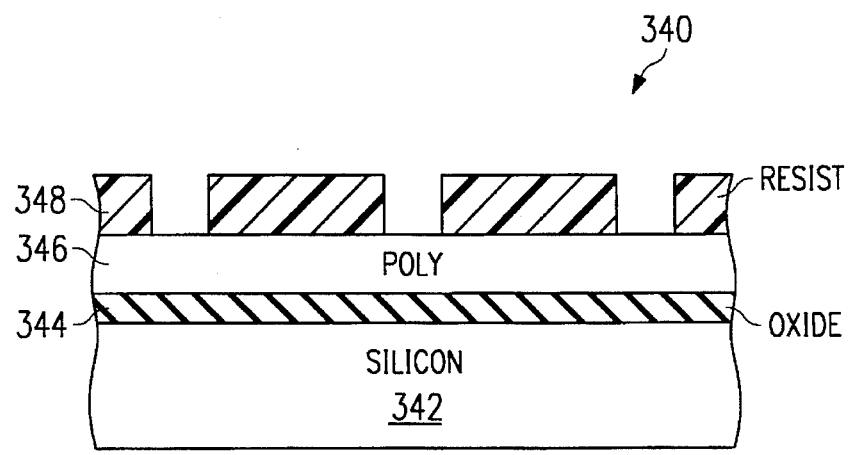
FIGS. 19A, 19B and 19C illustrate various stages in a plasma etch process that the present embodiment may monitor and control.

FIGS. 19A, 19B, 19C, and FIG. 20 illustrate an exemplary operation of a present embodiment. In particular, FIG. 19A shows a first stage of an etch process for an electronic device 340. Electronic device 340 includes silicon substrate layer 342 on which is deposited oxide layer 344. Polysilicon layer 346 covers oxide layer 344. A photoresist layer 348 covers predetermined portions of polysilicon layer 346. FIG. 19A represents a first stage I that corresponds to Region I of the plot of FIG. 20.

Figure 19B:
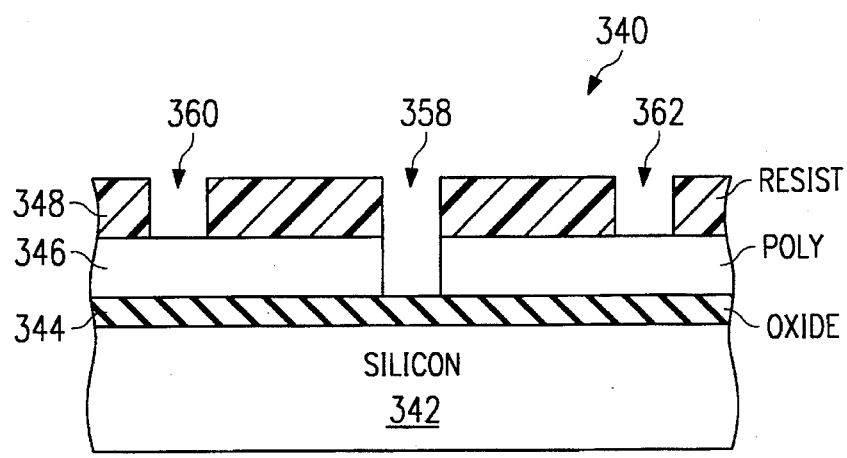
Figure 19C:
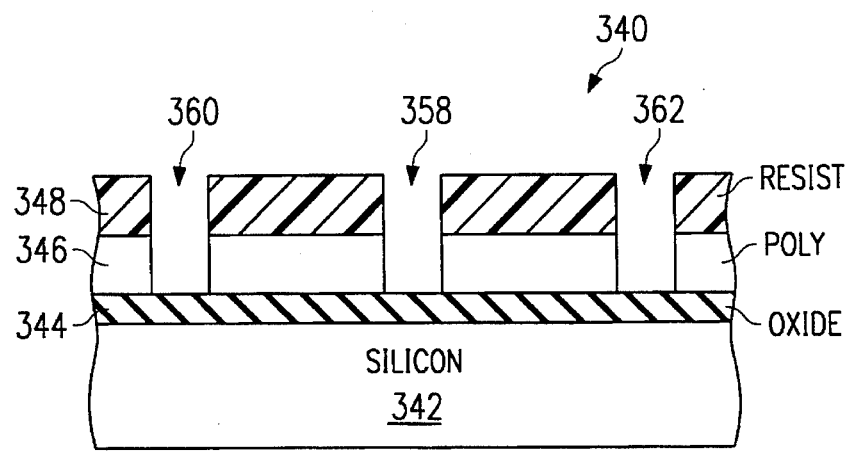
Figure 21:
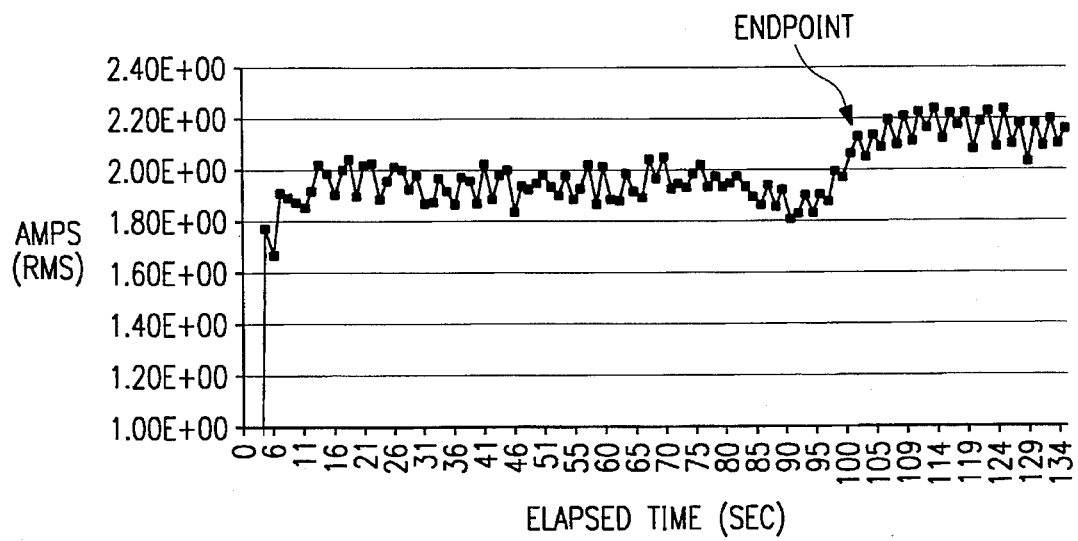
Figure 22:
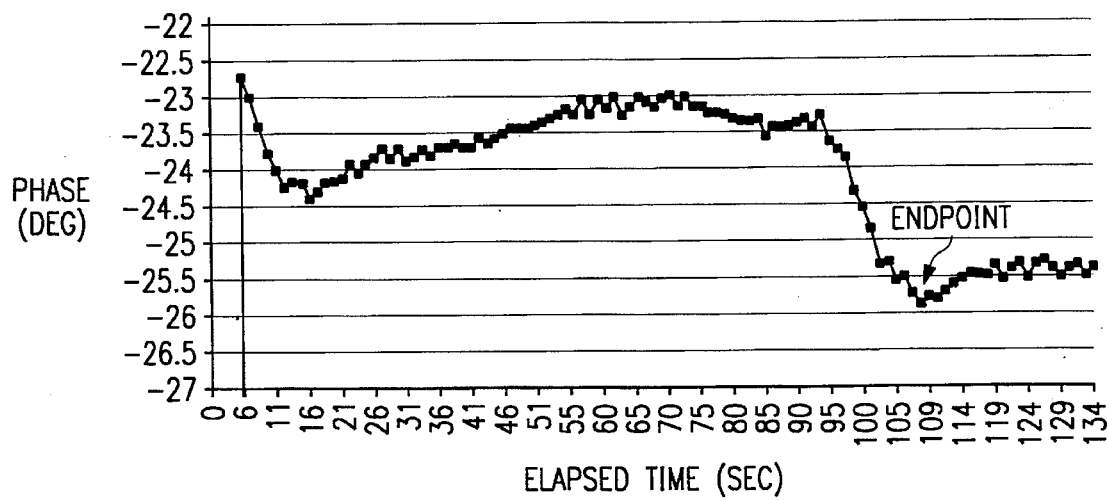
Figure 23:
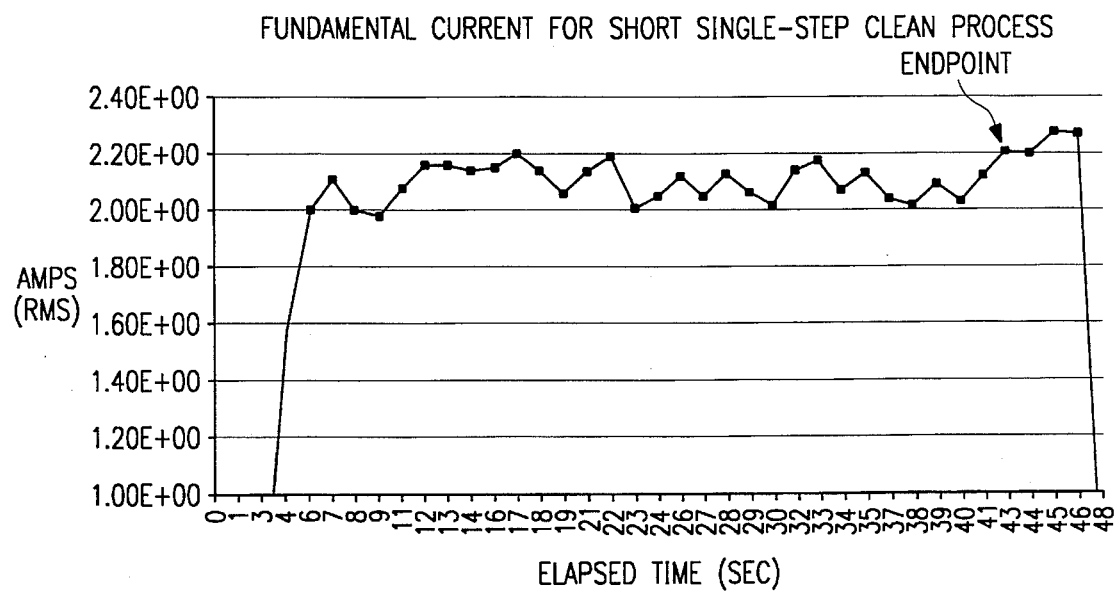
Figure 24:
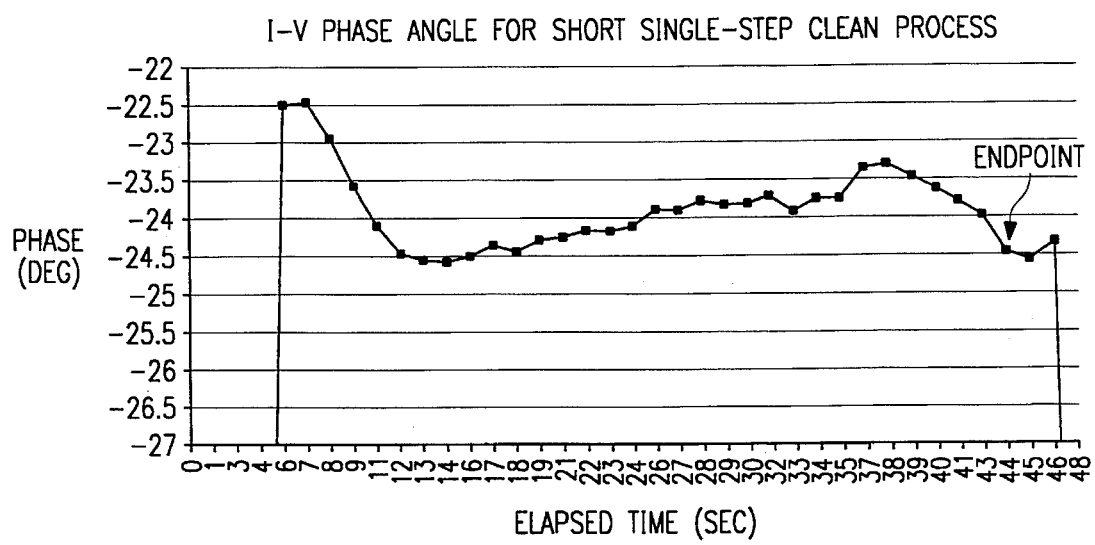
Figure 25:
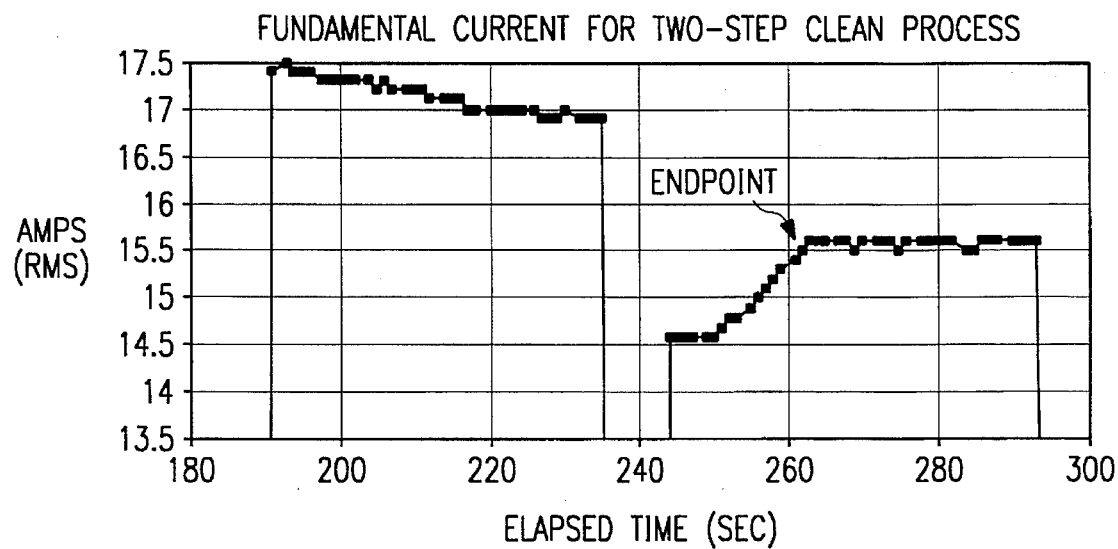
Figure 26:
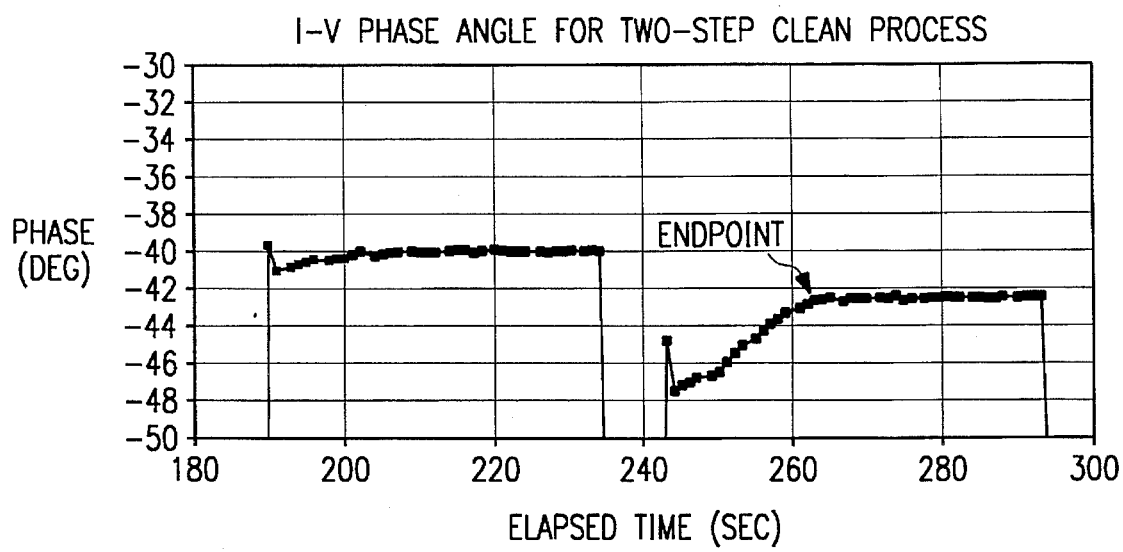

FIG. 20 plots in magnitude a first plot 350 of etch effluent as indicated by measurement line 352. Plot 354 shows with line 356 the change in discharge impedance for the various stages of etch processing within process chamber 20. Thus, in Region I, a highest degree of etch effluent exists with a lowest impedance level for the discharge impedance. As processing continues, due to the exposure of areas of polysilicon layer 346 in electronic device structure 340, part of polysilicon layer 346 is fully etched away as opening 358 of FIG. 19B illustrates. Likewise, part, but not all of, the area exposed at regions 360 and 362 has been etched away. Oxide layer 344, however, is not exposed in these regions. As a result, and referring to Region II in FIG. 20, etch effluent line 352 shows a reduction in magnitude. At the same time, discharge impedance line 356 starts to increase. The decrease in etch effluent values, as indicated by line 352, continues, as does the increase in discharge impedance line 356, until Region III of FIG. 20. This corresponds to the stage III that FIG. 19C depicts. In FIG. 19C, the etch process has removed all polysilicon layer 346 in region 358, region 360, and region 362 of structure. Since photoresist layer 348 prevents the removal of additional polysilicon and there is no further exposed polysilicon to remove in Region III of FIG. 20. Etch effluent line 352 decreases asymptotically to zero as the discharge impedance line 356 levels asymptotically approach a constant value.

The following discussion explains another example of operation of the present invention using a known fabrication reactor, such as those manufactured by Applied Materials having the name Applied Materials 5000 PECVD systems. This discussion demonstrates how in situ radio frequency metrology that the present invention provides could be applied to significantly reduce the cost of ownership for such fabrication systems. The present invention achieves cost reduction by increasing net throughput, decreasing scheduled maintenance time and cost, extending chamber kit hardware lifetime, decreasing test wafer usage, and improving average line and device yield. The present invention provides these technical advantages with a minimum of expense and installation time.

The present invention, therefore, can not only be applied to etch processes in order to detect process endpoint for (typically) patterned film removal prior to significant substrate or base layer loss due to overetching. These changes in wafer surface conditions often lead to dramatic changes in load impedance which are readily detected by the sensor 82 mounted directly to the cathode Note that this adjacent location is critical since necessary impedance matching networks act to remove this variance. As a result, a useful signal is obtained for an etch process endpoint by monitoring the system impedance in real time.

Changes in reactor wall conditions also lead to measured load impedance changes. As a result, fabrication reactor cleaning processes that are common in PECVD applications are also candidates for radio frequency voltage and current signal and phase angle monitoring. Indeed, the magnitude of impedance shift due to deposited chamber film removal is often large when compared to that for wafer films due to the significantly larger surface area involved. In addition, reactor geometry can lead to local regions of thicker deposition which would "clear" later during the clean process. These secondary endpoints are also detectable in the radio frequency signals.

The benefits of monitoring these signals are numerous. First of all, terminating clean processes at the optimal time protects chamber hardware from unnecessary overetching. This avoids premature replacement of this hardware. Secondly, monitoring these signals minimizes consumable costs and permits delaying scheduled maintenance for parts replacement until absolutely required. Without in situ monitoring, such schedules involve worst-case models that insure the process and, therefore, the yield are not adversely affected. Also, "timed" clean processes are designed to etch deposits for the thickest expected films in an environment of varying deposition rates and chamber conditions. Margins of error are also added in these calculations. As a consequence, throughput loss is often significant due to timed clean processes. Furthermore, optimizing etch times reduces costs associated with ozone-depleting PFC etchant gases such as $C_2F_6$ and $NF_3$.

Although reactor clean endpoint applications that the present invention makes possible alone represent a significant cost-of-ownership benefit, other opportunities for process improvement are available using additional information supplied by the radio frequency sensor. In particular, because it uses a unique broadband design, the present invention makes possible logging radio frequency spectral data. This data can be applied to predict key process outcomes by correlating harmonic fingerprints to measured wafer results. For example, with the present invention it is practical to predict the deposition rate of PECVD TEOS with reasonable accuracy by monitoring a few radio frequency current and voltage harmonics. Film stress can also be modelled using a linear regression model of radio frequency harmonic terms. Consequently, the present invention may be used as an in situ monitor of important film parameters. This may effectively reduce the need for time-consuming and costly wafer tests.

Control charts of these real-time parameters can be used to stabilize a process just as effectively as wafer-test based charts, but at a fraction of the cost. Additionally, the present system makes it possible to detect parameter drifts outside acceptable limits at the earliest moment. This could save product wafers from nonoptimal conditions. Line and device yields would likely improve over the standard method of process control, as result.

With these benefits in mind, consider the following application of the present embodiment similar to the configuration of system 60 of FIG. 5. One embodiment of sensor 82 was installed on two Applied Materials 5000 PECVD process chambers 20 between the output of impedance matching network 14 and the powered electrode 22. Initial manually triggered scans were made on various cleaning process recipes (both single and two-step processes) to analyze signal characteristics. The system 80 was configured to acquire radio frequency data automatically in the process steps of interest via a generic trigger interface. In the case of the single step processes (long and short etch times) data was obtained from system 80 in standard production mode over a period of more than a month. Data was automatically sent to hard disk 108 on the computer 86 and later downloaded for analysis. In the case of the two-step-clean, data was collected over several production days in the auto-trigger mode for all radio frequency powered steps.

In order to evaluate the system 80 for stress and deposition rate prediction capabilities, designed experiments were run on two process chambers 20. These experiments used varying power, TEOS flow, and susceptor spacing to force a wide range in deposition rate and an average stress value on the test wafers. Several centerpoint (i.e., nominal setpoint) replicates were run throughout the factorial trials in order to evaluate process drift and measurement error. Post-process analysis was done on an computer 866 using a statistical package known as Systat software.

From this application, typical process clean endpoint traces are shown in FIGS. 21 through 26. As is apparent from these Figures, one can readily see that shifts in both the fundamental current and current-voltage phase angle signals occur when the deposited chamber 20 films begin to clear. These changes are easily detected by system 80 and can be used to trigger a process termination via programmed endpoint detection process flow as described in FIG. 10.

Figure 27:
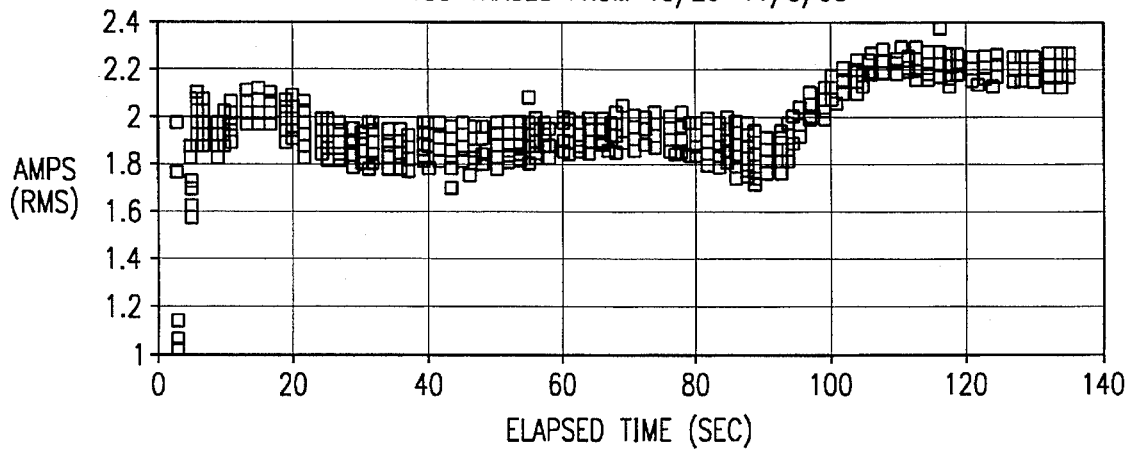
Figure 28:
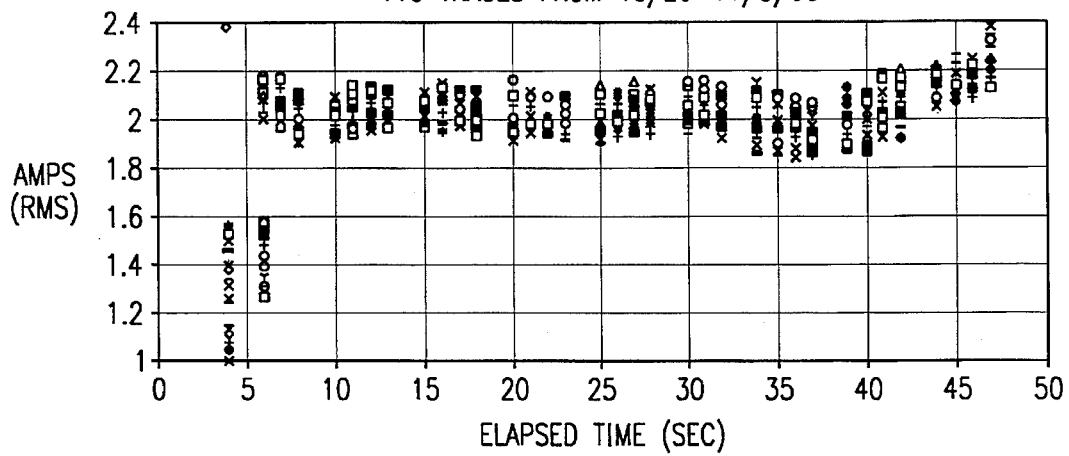

Note that in both the long and short single-step clean processes as well as in the two-step-clean process, significant overetching is apparent. During this overetch period, the process kit is subjected to high ion bombardment and is being unnecessarily damaged by sputtering. This reduces kit lifetime and increases hardware "consumables" cost, FIGS. 27 and 28 demonstrate repeatability of the endpoint signal from the present invention. These overlay plots show individual clean endpoint traces over days of production time and are remarkably similar. Changes are seen in the average starting level over time, but the shift in signal level is generally constant. System 80 can be set up to trigger endpoint based on an average level change. Consequently, the starting signal level is not a concern.

Figures 30, 31:
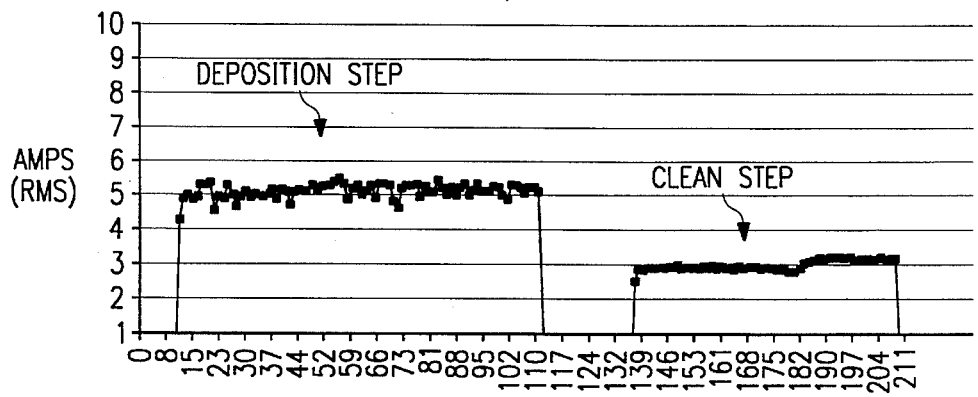

Spectral data was obtained for each setting during a full factorial stress DOX. The table of FIG. 29 shows the results of obtaining spectral data during a full factorial stress DOX. Wafer measurements were made for comparison. The radio frequency data in the FIG. 29 table represent means of each voltage (in RMS volts) and current harmonic (in RMS amps) plus the fundamental phase angle (in degrees) over a 30-second period (t=60 to 90 seconds during the 100 second deposition cycle) when the signals were quite stable. FIG. 30 shows a representative scan of the radio frequency data from statistical analysis and models were built using radio frequency parameters as input factors and wafer results as output functions. The purpose of this analysis was to predict wafer responses from the in situ radio frequency measurements.

Figure 32:
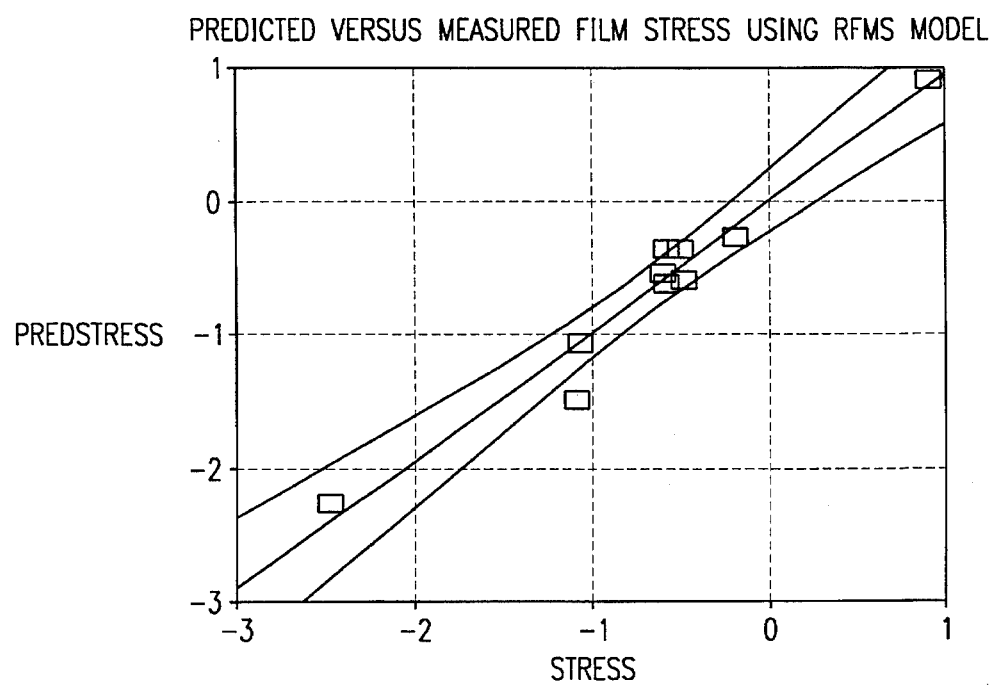
Figure 33:
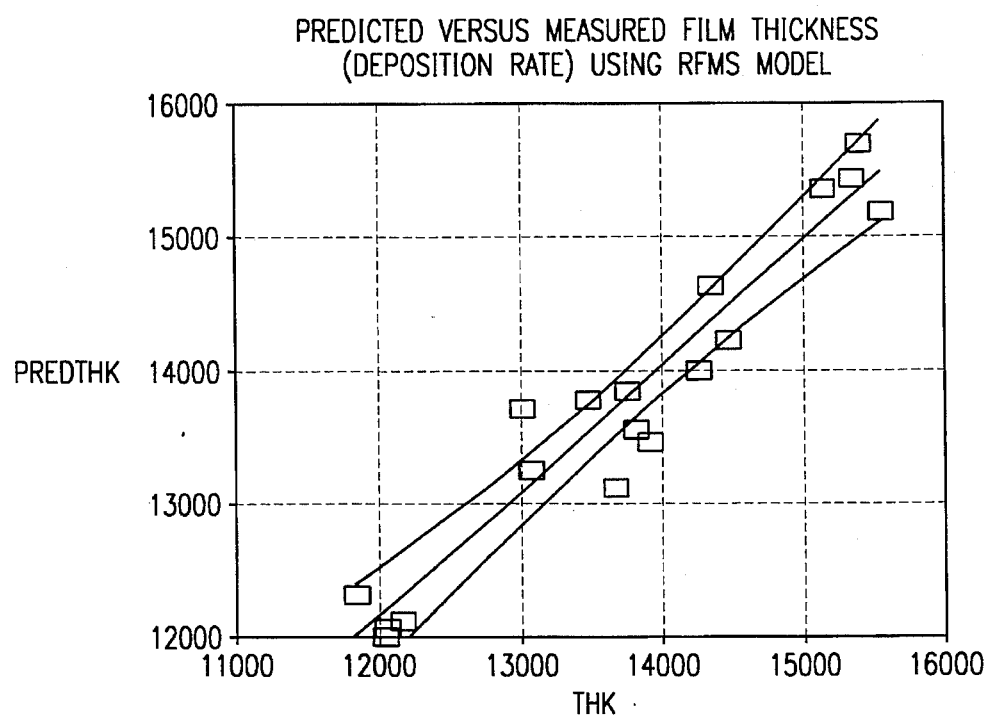

An excellent linear regression model was obtained for film stress using a subset of the available spectral signals and a similar DOX resulted in a good model for deposited thickness (which is directly applicable to deposition rate). The coefficients and ANOVA generated for a linear model of film stress are shown in the t of FIG. 31. This model can be used to predict wafer results in real time by utilizing radio frequency parameter measurements without the downtime and expense of wafer testing. FIGS. 32 and 33 graphically demonstrate the relationship between predicted/measured stress and predicted/measured deposition rate, respectively. The confidence intervals are drawn to show that the in situ measurement can accurately forecast the deposition rate and film stress during the deposition process to tight limits. These models could be used to significantly reduce test wafer measurements and therefore cost.

In summary, this demonstration shows how in situ radio frequency metrology using the present invention can be applied to reduce cost-of-ownership associated with the Applied Materials 5000 PECVD system through improved process control and reduction in wasteful wafer qualification costs. Costs are further reduced by optimizing clean cycles; significantly lowering hardware replacement frequency and reducing PFC gas consumption. Improved process models used to optimize wafer results are likely to result from the application of radio frequency parameter data obtained directly at the powered electrode leading to better process performance and device yields.

ALTERNATIVE EMBODIMENTS

In summary, the present invention provides a method and system for monitoring the radio frequency power of a plasma in an electronic device fabrication reactor and includes the necessary components and steps of sensing the voltage of the radio frequency power that is directed into a plasma producing gas at the input to the plasma producing environment of the electronic device fabrication reactor. The method senses also the current and phase angle of the radio frequency power that is directed into the plasma producing gas, also at the input to the plasma producing environment. The method more completely measures the load that the radio frequency power sees by measuring the full load impedance of the plasma producing environment. The full load, in one embodiment, represents not only the discharge and sheath impedances, but also the chuck and wafer impedance, a primary ground path impedance, and a secondary ground path impedance that associates with the plasma environment of the fabrication reactor. The method permits controlling the plasma environment by accurately measuring voltage, current, and phase associated with the plasma environment.

Although the invention has been described in detail herein with reference to the illustrative embodiments, it is to be understood that this description is by way of example only and is not to be construed in a limiting sense. For example, the following exemplary modification is well within the scope of the present invention. Not only can the present invention be employed in single wafer processes or single wafer fabrication reactors, but also the present invention may be applied to cluster tools, batch process fabrication reactors and numerous other types of process chambers and fabrication reactors for more precisely and directly controlling the plasma process environment.

It is to be further understood, therefore, that numerous changes in the details of the embodiments of the invention and additional embodiments of the invention, will be apparent to, and may be made by, persons of ordinary skill in the art having reference to this description. It is contemplated that all such changes and additional embodiments are within the spirit and true scope of the invention as claimed below.

What is claimed is:

1. A method for controlling the generation of plasma in a electronic device fabrication reactor, comprising the steps of:

sensing the voltage of the radio frequency power directed to a plasma-producing gas at the input to the plasma-producing environment of the electronic device fabrication reactor;

sensing the current of the radio frequency power directed to the plasma-producing gas at the input to the plasma-producing environment;

sensing the phase angle of the radio frequency power directed to the plasma-producing gas at the input to the plasma-producing environment;

measuring the full load impedance of the plasma-producing environment fabrication reactor; and controlling the voltage, current, and phase angle of the radio frequency power directed to the plasma-producing gas within a predetermined region of variability.

2. The method of claim 1, further comprising the step of controlling the voltage for the radio frequency power directed to the plasma-producing gas using a closed-loop control mechanism.

3. The method of claim 1, further comprising the step of controlling the current for the radio frequency power directed to the plasma-producing gas using a closed-loop control mechanism.

4. The method of claim 1, further comprising the step of controlling the current for the radio frequency power directed to the plasma-producing gas using a closed-loop control mechanism.

5. The method of claim 1, further comprising the step of generating an endpoint signal in response to sensing a predetermined endpoint of an electronic device fabrication process as determined by measurement of the voltage, the current, and the phase angle during the fabrication process.

6. The method of claim 1, further comprising the step of generating a process halt signal in response to sensing a predetermined halt point for preventing initiation of the electronic device fabrication process as determined by measurement of the voltage, the current, and the phase angle of the plasma environment within the fabrication reactor.

7. A method for controlling the generation of a plasma in an plasma process environment for fabrication an electronic device in a fabrication reactor, comprising the steps of:

sensing the voltage of the radio frequency power directed to a plasma-producing gas at the input to the plasma-producing environment during the fabrication of the electronic device in the fabrication reactor;

sensing the current of the radio frequency power directed to the plasma-producing gas at the input to the plasma-producing environment during the fabrication of the electronic device;

sensing the phase angle of the radio frequency power directed to the plasma-producing gas at the input to the plasma-producing environment during the fabrication of the electronic device;

measuring the full load impedance of the plasma-producing environment during the fabrication of the electronic device;

generating control limits for the voltage, the current, and the phase angle of the radio frequency power using a set of statistical modelling instructions for modelling the fabrication of the electronic device;

controlling the voltage, current, and phase angle of the radio frequency power directed to the plasma-producing gas according to the control limits during the fabrication of the electronic device in the fabrication reactor.

8. The method of claim 7, further comprising the step of controlling the voltage for the radio frequency power directed to the plasma-producing gas using a closed-loop control mechanism.

9. The method of claim 7, further comprising the step of controlling the current for the radio frequency power directed to the plasma-producing gas using a closed-loop control mechanism.

10. The method of claim 7, further comprising the step of controlling the phase angle for the radio frequency power directed to the plasma-producing gas using a closed-loop control mechanism.

11. The method of claim 7, wherein said statistical modelling instructions comprise step-wise linear regression modelling instructions for iteratively determining correlations between a determined set of parameters and the voltage, the current, and the phase angle.

12. The method of claim 7, further comprising the step of generating an endpoint signal in response to sensing a predetermined endpoint of an electronic device fabrication process as determined by sensing the voltage, the current, and the phase angle of the radio frequency power into the plasma environment.

13. The method of claim 7, further comprising the step of generating an process halt signal in response to sensing a predetermined halt point for preventing initiation of the electronic device fabrication process as determined by sensing the voltage, the current, and the phase angle of the radio frequency power into the plasma environment.

14. A method for controlling the fabrication of an electronic device by generating a process halt signal according to predetermined parameters associated with a plasma process environment of a fabrication reactor, comprising the steps of:

inputting a plurality of process parameters regarding the electronic device process into a process control computer, the process control computer comprising a plurality of process control instructions for controlling the processing of the electronic device;

incrementing a process recipe step counter associated with the plurality of process control instructions for the electronic device fabrication process;

acquiring and storing within the process control computer data regarding the electronic device fabrication plasma process environment;

testing for the completion of a predetermined monitor time for monitoring the processing of the electronic device;

averaging a predetermined set of process parameters relating to the electronic device upon the determining of completion of the predetermined monitor time;

determining the presence of a reference subtraction signal indicating the presence of a reference subtraction instruction in the plurality of process control instructions;

subtracting reference information from the averaged processed process parameters upon determining the presence of the reference substraction signal according to the reference subtraction instruction;

checking a plurality of control limits, said control limits forming a part of the plurality of process parameters for the limiting the control of electronic device fabrication process according to the subtracted reference information;

generating an out of control signal upon determining one or more of the values of the subtracted reference information to be beyond an associated one of the plurality of control limits; and generating a process halt signal for the electronic device fabrication process in response to the out of control signal.

15. A method for controlling the fabrication of an electronic device by generating an endpoint detection signal according to predetermined parameters of a plasma process environment of a fabrication reactor, comprising the steps of:

inputting a plurality of process parameters regarding the electronic device process into a process control computer, the process control computer comprising a plurality of process control instructions for controlling processing of the electronic device;

incrementing a process recipe step counter associated with the plurality of process control instructions for the electronic device fabrication process;

acquiring and storing within the process control computer data regarding the electronic device fabrication plasma process environment;

determining a plurality of normalized endpoint values using a plurality of endpoint normalization instructions;

determining the completion of a normalization time;

acquiring a plurality of normalized process values upon the completion of the normalization time;

applying a plurality of endpoint detection tests to determine the existence of an endpoint in the electronic device fabrication;

generating an output endpoint signal upon detecting a process endpoint;

starting an overetch clock upon the generation of an output endpoint signal;

generating an overetch end signal at a predetermined point in time after starting the overetch clock; and terminating the ongoing process steps upon the generation of the overetch end signal.

16. A system for controlling the generation of plasma in a electronic device fabrication reactor, comprising:

voltage sensing circuitry for sensing the voltage of the radio frequency power directed to a plasma-producing gas at the input to the plasma-producing environment of the electronic device fabrication reactor;

current sensing circuitry for sensing the current of the radio frequency power directed to the plasma-producing gas at the input to the plasma-producing environment;

phase angle sensing circuitry for sensing the phase angle of the radio frequency power directed to the plasma-producing gas at the input to the plasma-producing environment of the electronic device fabrication reactor;

impedance measuring circuitry for measuring the full load impedance associated with the plasma-producing environment of the electronic device fabrication reactor;

control circuitry for controlling the voltage, current, and phase angle of the radio frequency power directed to the plasma-producing gas within a predetermined region of variability to achieve a predetermined minimum reflected power level in the radio frequency power to the electronic device fabrication reactor.

17. The controlling system of claim 16, further comprising a closed-loop gain control mechanism for automatically controlling the gain of said voltage sensing circuitry.

18. The controlling system of claim 16, further comprising a closed-loop gain control mechanism for automatically controlling the gain of said current sensing circuitry.

19. The controlling system of claim 16, further comprising a closed-loop gain control mechanism for automatically controlling the gain of said phase angle sensing circuitry.

20. The controlling system of claim 16, further comprising endpoint generating circuitry for generating an endpoint signal in response to sensing at least one of said voltage, said current, and said phase angle reaching a predetermined endpoint of an electronic device fabrication process.

21. The controlling system of claim 16, further comprising endpoint generating circuitry for generating a process halt signal in response to sensing at least one of said voltage, said current, and said phase angle reaching a predetermined halt point for preventing initiation of an electronic device fabrication process.

22. A system for controlling the generation of a plasma in an plasma process environment for an electronic device in a fabrication reactor, comprising:

voltage sensing circuitry for sensing the voltage of the radio frequency power directed to a plasma-producing gas at the input to the plasma-producing environment during the fabrication of the electronic device in the fabrication reactor;

current sensing circuitry for sensing the current of the radio frequency power directed to the plasma-producing gas at the input to the plasma-producing environment during the fabrication of the electronic device in the fabrication reactor;

phase angle sensing circuitry for sensing the phase angle of the radio frequency power directed to the plasma-producing gas at the input to the plasma-producing environment during the fabrication-of the electronic device in the fabrication reactor;

impedance measuring circuitry for measuring the full load impedance of the plasma-producing environment during the fabrication of the electronic device in the fabrication reactor;

statistical modelling instructions for generating control limits for said voltage, said current, and said phase angle of the radio frequency power for modelling the fabrication of the electronic device; and control circuitry for controlling the voltage, current, and phase angle of the radio frequency power directed to the plasma-producing gas according to the control limits during the fabrication of the electronic device in the fabrication reactor.

23. The controlling system of claim 22 further comprising a closed-loop gain control mechanism for automatically controlling the gain of the sensed voltage of the radio frequency power.

24. The controlling system of claim 22, further comprising a closed-loop gain control mechanism for automatically controlling the gain of the sensed current of the radio frequency power.

25. The controlling system of claim 22, further comprising a closed-loop control mechanism for automatically controlling the gain of the sensed phase angle for the radio frequency power.

26. The controlling system of claim 22, wherein said statistical modelling instructions comprise stepwise linear regression modelling instructions for iteratively determining correlations between a plurality of parameters and the voltage, the current, and the phase angle for generating the control limits.

27. The controlling system of claim 22, further comprising endpoint determining instructions for generating an endpoint signal in response to sensing the voltage, the current, and the phase angle of the radio frequency power and indicating reaching a predetermined endpoint of an electronic device fabrication process.

28. The controlling system of claim 22, further comprising process halt point determining instructions for generating an process halt signal in response to sensing the voltage, the current, and the phase angle of the radio frequency power indicating reaching a predetermined halt point for preventing initiation of the electronic device fabrication process.

29. A system for controlling the fabrication of an electronic device by generating a process halt signal according to predetermined parameters of a fabrication reactor, comprising:

a process control computer associated with a fabrication reactor and comprising a plurality of process control instructions for controlling processing of the electronic device;

an input mechanism for inputting a plurality of process parameters regarding the electronic device process into said process control computer;

process recipe incrementing instructions for incrementing a process recipe step counter associated with the plurality of process control instructions;

data acquiring instructions acquiring and storing within the process control computer data regarding the electronic device fabrication environment;

clocking instructions determining the completion of a predetermined monitor time for monitoring the processing of the electronic device;

averaging instructions for averaging a predetermined set of process parameters relating to the electronic device upon the determination of the completion of predetermined monitor time;

reference subtraction signal indicating instructions for determining the presence of a reference subtraction signal indicating the presence of a reference subtraction instruction in the process control instructions;

reference subtraction signal instructions for subtracting reference information from the averaged processed process parameters upon the determination of the presence of the reference substraction signal according to the reference subtraction instruction;

control limit checking instructions for checking a plurality of control limits, said control limits forming a part of the plurality of process parameters for the limiting the control of electronic device fabrication process according to the subtracted reference information;

out of control signal generating instructions for generating an out of control signal upon determining one or more of the values of the subtracted reference information to be beyond an associated one of the plurality of control limits; and process halt signal generating instructions for generating a process halt signal for halting the electronic device fabrication process in response to the out of control signal.

30. A system for controlling the fabrication of an electronic device by generating an endpoint detection signal according to predetermined parameters of a fabrication reactor, comprising the steps of:

a process control computer comprising a plurality of process control instructions for controlling processing of the electronic device;

an input mechanism for inputting a plurality of process parameters regarding the electronic device process into said process control computer;

a process recipe step counter associated with said plurality of process control instructions for counting successive operations of said plurality of process control instructions;

a first set of data acquisition instructions for acquiring and storing within the process control computer data regarding the electronic device fabrication environment;

a plurality of endpoint normalization instructions for determining a plurality of normalized endpoint values associated with the electronic device fabrication process;

timing instructions for determining the completion of a normalization time;

a second set of data acquisition instructions for acquiring a plurality of normalized process values upon the completion of the normalization time;

a plurality of endpoint detection tests for determining the existence of an endpoint in the electronic device fabrication;

output endpoint signal generating instructions for generating an output endpoint signal upon the detecting a process endpoint;

clock operating instructions for starting an overetch clock upon the generation of an output endpoint signal;

overetch end signal instructions for generating an overetch end signal at a predetermined point in time after starting the overetch clock; and terminating instructions for terminating the ongoing process steps upon the generation of the overetch end signal.

31. An electronic device fabrication reactor system for fabricating an electronic device in a plasma environment comprising:

a radio frequency power supply for directing radio frequency power having a voltage, a current, and a phase angle;

a process chamber for holding a plasma and processing the electronic device;

a plasma gas for producing the plasma within said process chamber by receiving the radio frequency power from said radio frequency power source;

a plasma environment control system for controlling the generation of said plasma comprising:

voltage sensing circuitry for sensing said voltage of the radio frequency power directed to a plasma gas at the input of said plasma environment of said electronic device fabrication reactor;

current sensing circuitry for sensing the current of the radio frequency power directed to the plasma gas at the input to said plasma environment;

phase angle sensing circuitry for sensing the phase angle of the radio frequency power directed to the plasma gas at the input to the plasma environment;

impedance measuring circuitry for measuring the full load impedance of the plasma-producing environment of the electronic device fabrication reactor; and radio frequency power control circuitry for controlling the voltage, current, and phase angle of the radio frequency power directed to the plasma-producing gas within a predetermined region of variability.

32. The fabrication reactor of claim 31, further comprising automatic voltage gain control circuitry for automatically controlling the voltage of the radio frequency power directed to the plasma-producing gas using a closed-loop control mechanism.

33. The fabrication reactor of claim 31, further comprising automatic current gain control circuitry for automatically controlling the current of the radio frequency power directed to the plasma-producing gas using a closed-loop control mechanism.

34. The fabrication reactor of claim 31, further comprising automatic phase angle gain control circuitry for automatically controlling the phase angle for the radio frequency power directed to the plasma-producing gas using a closed-loop control mechanism.

35. The fabrication reactor of claim 31, further comprising endpoint signal generating circuitry for generating an endpoint signal in response to sensing the voltage, the current, and the phase angle reaching a predetermined endpoint of an electronic device fabrication process.

36. The fabrication reactor of claim 31, further comprising process halt signal generating circuitry for generating a process halt signal in response to sensing the voltage, the current, and the phase angle reaching a predetermined halt point indicating a need to prevent initiation of the electronic device fabrication process.

37. An electronic device fabrication reactor system for fabricating an electronic device in a plasma environment, comprising the steps:

a radio frequency power supply for directing radio frequency power having a voltage, a current, and a phase angle;

a process chamber for holding a plasma and processing the electronic device;

a plasma gas for producing the plasma with said process chamber by receiving the radio frequency power from said radio frequency power source; and a plasma environment control system for controlling the generation of said plasma in the plasma environment, said plasma environment control system, comprising:

voltage sensing circuitry for sensing the voltage of the radio frequency power directed to a plasma gas at the input to the plasma environment during the fabrication of the electronic device in the fabrication reactor;

current sensing circuitry for sensing the current of the radio frequency power directed to the plasma-producing gas at the input to the plasma-producing environment during the fabrication of the electronic device in the fabrication reactor;

phase angle sensing circuitry for sensing the phase angle of the radio frequency power directed to the plasma-producing gas at the input to the plasma-producing environment;

impedance measuring circuitry for measuring the full load impedance of the plasma-producing environment during the fabrication of the electronic device in the fabrication reactor;

statistical modelling instructions for generating control limits for the voltage, the current, and the phase angle of the radio frequency power; and controlling circuitry for controlling the voltage, current, and phase angle of the radio frequency power directed to the plasma-producing gas according to the control limits during the fabrication of the electronic device in the fabrication reactor.

38. The fabrication reactor of claim 37, further comprising voltage signal controlling circuitry having a closed-loop control mechanism for automatically controlling the gain of the voltage signal from the radio frequency power.

39. The fabrication reactor of claim 37, further comprising current signal controlling circuitry having a closed-loop control mechanism for automatically controlling the gain of the current signal from the radio frequency power.

40. The fabrication reactor of claim 37, further comprising phase angle signal controlling circuitry having a closed-loop control mechanism for automatically controlling the gain of the phase angle signal from the radio frequency power.

41. The fabrication reactor of claim 37, wherein said statistical modelling instructions comprise stepwise linear regression modelling instructions for iteratively determining correlations between a plurality of parameters and the voltage, the current, and the phase angle for generating the control limits.

42. The fabrication reactor of claim 37, further comprising endpoint signal generating circuitry for generating an endpoint signal in response to at least one of the voltage, the current, and the phase angle of the radio frequency power reaching a predetermined endpoint of an electronic device fabrication process.

43. The fabrication reactor of claim 37, further comprising process halt signal generating circuitry for generating a process halt signal in response to at least one of the voltage, the current, and the phase angle of the radio frequency power reaching a predetermined halt point indicating the need to prevent initiation of an electronic device fabrication process.

* * * * *